(12) United States Patent
Ohtani et al.

(10) Patent No.: US 7,998,844 B2
(45) Date of Patent: *Aug. 16, 2011

(54) METHOD FOR MANUFACTURING A SEMICONDUCTOR DEVICE

(75) Inventors: Hisashi Ohtani, Isehara (JP); Akiharu Miyanaga, Hadano (JP); Takeshi Fukunaga, Atsugi (JP); Hongyong Zhang, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/219,026

(22) Filed: Jul. 15, 2008

(65) Prior Publication Data

US 2009/0035923 A1 Feb. 5, 2009

Related U.S. Application Data

(62) Division of application No. 11/322,660, filed on Jan. 3, 2006, now abandoned, which is a division of application No. 10/026,802, filed on Dec. 27, 2001, now Pat. No. 6,998,639, which is a division of application No. 08/633,307, filed on Apr. 15, 1996, now Pat. No. 6,335,541, which is a division of application No. 08/329,644, filed on Oct. 25, 1994, now Pat. No. 5,643,826.

(30) Foreign Application Priority Data

| Oct. 29, 1993 | (JP) | 5-294633 |
|---|---|---|
| Nov. 9, 1993 | (JP) | 5-303436 |
| Nov. 12, 1993 | (JP) | 5-307206 |
| Jun. 20, 1994 | (JP) | 6-162705 |

(51) Int. Cl.
| H01L 21/20 | (2006.01) |
|---|---|
| H01L 21/36 | (2006.01) |
| H01L 21/22 | (2006.01) |
| H01L 21/38 | (2006.01) |
| H01L 21/31 | (2006.01) |
| H01L 21/469 | (2006.01) |
| H01L 21/00 | (2006.01) |

(52) U.S. Cl. ........ 438/486; 438/542; 438/787; 438/795; 257/72; 257/75; 257/E21.297; 257/E21.37; 257/E21.413

(58) Field of Classification Search .................. None
See application file for complete search history.

(56) References Cited

U.S. PATENT DOCUMENTS 3,108,914 A 10/1963 Hoerni
(Continued)

FOREIGN PATENT DOCUMENTS

EP 0 390 608 10/1990
(Continued)

OTHER PUBLICATIONS

Helmenstine, Anne M. Phosphorus Facts, Chemical & Physical Properties of Phosphorus. About.com, 2010 [online]. Retrieved on Feb. 22, 2010. Retrieved from Internet: <URL: http://chemistry.about.com/od/elementfacts/a/phosphorus.htm?p=1>.*

(Continued)

*Primary Examiner* — Hoang-Quan T Ho
(74) *Attorney, Agent, or Firm* — Eric J. Robinson; Robinson Intellectual Property Law Office, P.C.

(57) ABSTRACT

A process for fabricating a highly stable and reliable semiconductor, comprising: coating the surface of an amorphous silicon film with a solution containing a catalyst element capable of accelerating the crystallization of the amorphous silicon film, and heat treating the amorphous silicon film thereafter to crystallize the film.

21 Claims, 15 Drawing Sheets

U.S. PATENT DOCUMENTS

| | | | |
|---|---|---|---|
| 3,389,024 A | 6/1968 | Schimmer | |
| 3,783,049 A | 1/1974 | Sandera | |
| 3,988,762 A | 10/1976 | Cline et al. | |
| 4,068,020 A | 1/1978 | Reuschel | |
| 4,309,224 A | 1/1982 | Shibata | |
| 4,379,020 A | 4/1983 | Glaeser et al. | |
| 4,472,458 A | 9/1984 | Sirinyan et al. | |
| 4,534,820 A | 8/1985 | Mori et al. | |
| 4,623,912 A | 11/1986 | Chang et al. | |
| 4,746,628 A | 5/1988 | Takafuji et al. | |
| 4,766,477 A | 8/1988 | Nakagawa et al. | |
| 4,801,351 A | 1/1989 | Awane et al. | |
| 4,911,781 A | 3/1990 | Fox et al. | |
| 4,933,298 A | 6/1990 | Hasegawa | |
| 4,959,247 A | 9/1990 | Moser et al. | |
| 5,010,033 A | 4/1991 | Tokunaga et al. | |
| 5,075,259 A | 12/1991 | Moran | |
| 5,130,103 A | 7/1992 | Yamagata et al. | |
| 5,130,264 A | 7/1992 | Troxell et al. | |
| 5,147,826 A | 9/1992 | Liu et al. | |
| 5,177,578 A | 1/1993 | Kakinoki et al. | |
| 5,219,786 A | 6/1993 | Noguchi | |
| 5,244,836 A | 9/1993 | Lim | |
| 5,248,630 A | 9/1993 | Serikawa et al. | |
| 5,275,851 A | 1/1994 | Fonash et al. | |
| 5,278,093 A | 1/1994 | Yonehara | |
| 5,352,291 A | 10/1994 | Zhang et al. | |
| 5,354,697 A | 10/1994 | Oostra et al. | |
| 5,358,907 A | 10/1994 | Wong | |
| 5,387,530 A | 2/1995 | Doyle et al. | |
| 5,403,772 A | 4/1995 | Zhang et al. | |
| 5,426,064 A | 6/1995 | Zhang et al. | |
| 5,480,811 A | 1/1996 | Chiang et al. | |
| 5,481,121 A | 1/1996 | Zhang et al. | |
| 5,488,000 A | 1/1996 | Zhang et al. | |
| 5,492,843 A * | 2/1996 | Adachi et al. | 438/479 |
| 5,501,989 A | 3/1996 | Takayama et al. | |
| 5,508,533 A | 4/1996 | Takemura | |
| 5,529,937 A | 6/1996 | Zhang et al. | |
| 5,531,182 A | 7/1996 | Yonehara | |
| 5,569,936 A | 10/1996 | Zhang et al. | |
| 5,585,291 A * | 12/1996 | Ohtani et al. | 438/486 |
| 5,605,846 A | 2/1997 | Ohtani et al. | |
| 5,608,232 A | 3/1997 | Yamazaki et al. | |
| 5,614,426 A | 3/1997 | Funada et al. | |
| 5,639,698 A * | 6/1997 | Yamazaki et al. | 438/486 |
| 5,643,826 A * | 7/1997 | Ohtani et al. | 438/162 |
| 5,646,424 A | 7/1997 | Zhang et al. | |
| 5,696,388 A | 12/1997 | Funada et al. | |
| 5,882,960 A | 3/1999 | Zhang et al. | |
| 5,895,933 A | 4/1999 | Zhang et al. | |
| 5,897,347 A | 4/1999 | Yamazaki et al. | |
| 5,923,962 A | 7/1999 | Ohtani et al. | |
| 5,949,091 A | 9/1999 | Yamaguchi | |
| 5,956,579 A | 9/1999 | Yamazaki et al. | |
| 6,084,247 A | 7/2000 | Yamazaki et al. | |
| 6,335,541 B1 | 1/2002 | Ohtani et al. | |
| 6,884,698 B1 * | 4/2005 | Ohtani et al. | 438/486 |
| 6,998,639 B2 | 2/2006 | Ohtani et al. | |

FOREIGN PATENT DOCUMENTS

| | | |
|---|---|---|
| EP | 0 612 102 | 8/1994 |
| EP | 0 631 325 | 12/1994 |
| JP | 58-68923 | 4/1983 |
| JP | 60-105216 | 6/1985 |
| JP | 63-142807 | 6/1988 |
| JP | 63-318162 | 12/1988 |
| JP | 64-074754 | 3/1989 |
| JP | 01-135014 | 5/1989 |
| JP | 01-206632 | 8/1989 |
| JP | 1-206632 | 11/1989 |
| JP | 01-276616 | 11/1989 |
| JP | 02-020059 | 1/1990 |
| JP | 2-119122 | 5/1990 |
| JP | 2-140915 | 5/1990 |
| JP | 02-143415 | 6/1990 |
| JP | 02-222546 | 9/1990 |
| JP | 02-260524 | 10/1990 |
| JP | 03-280420 | 12/1991 |
| JP | 4-011722 | 1/1992 |
| JP | 04-022120 | 1/1992 |
| JP | 04-318973 | 11/1992 |
| JP | 05-067635 | 3/1993 |
| JP | 05-067785 | 3/1993 |
| JP | 05-082442 | 4/1993 |
| JP | 07-058338 | 3/1995 |
| WO | WO 86/03621 | 6/1986 |
| WO | WO 92/01089 | 1/1992 |

OTHER PUBLICATIONS

European Search Report (Application No. 01116025.6) dated Mar. 5, 2004.

C. Hayzelden et al., "In Situ Transmission Electron Microscopy Studies of Silicide-Mediated Crystallization of Amorphous Silicon," App. Phys. Lett., (Applied Physics Letters) vol. 60, No. 2, pp. 225-227.

S. P. Murarka, "Silicides for VLSI Applications," 1983, pp. 82, 112.

A. V. Dvurechenskii et al., "Transport Phenomena in Amorphous Silicon Doped by Ion Implantation of 3d Metals," Phys. Stat. Sol., (a) 95 (1986), No. 2, pp. 635-640.

A. Yu. Kuznetsov et al., "Enhanced Solid Phase Epitaxial Recrystallization of Amorphous Silicon Due to Nickel Silicide Precipitation Resulting From Ion Implantation and Annealing," Nucl. Instrum. Methods Phys. Res. B. Beam Interact. Mater. Atoms (Nuclear Instruments & Methods in Physics Research, Section B. Beam Interactions with Materials and Atoms, vol. 80-81. (1993), pp. 990-993.

S. Coffa et al. (eds.), "Metal-Enhanced Growth of Silicon," Crucial Issues in Semiconductor Materials and Processing Technologies, 1992, Kluwer Academic Publishers, pp. 483-499.

Oki et al., Short Notes, "Effect of Deposited Metals on the Crystallization Temperature of Amorphous Germanium Film," *Jpn. J. Appl. Phys.* No. 8, (1969), Jun. 2, 1969, p. 1056.

Ultra LSI Process Data Handbook, Apr. 15, 1982, pp. 124-125.

Batstone et al., "Microscopic Processes in Crystallization," Solid State Phenomena, vols. 37-38, pp. 257-268.

Graef et al., "Enhanced Crystallinity of Silicon Films Deposited by CVD on Liquid Layers (CVDOLLProcess): Silicon on Tin Layers in the Presence of Hydrogen Chloride," Journal of Applied Physics, vol. 48, No. 9, Sep. 1977, pp. 3937-3940.

Kakkad et al., "Crystallized Si Films by Low-Temperature Rapid Thermal Annealing of Amorphous Silicon," J. Appl. Phys., vol. 65, No. 5, Mar. 1, 1989, pp. 2069-2072.

Kakkad et al., "Low Temperature Selective Crystallization of Amorphous Silicon," Journal of Non-Crystalline Solids 115 (1989), pp. 66-68.

Liu et al., "Polycrystalline Silicon Thin Film Transistors on Corning 7059 Glass Substrates Using Short Time, Low-Temperature Processing," Appl. Phys. Lett., vol. 62, No. 20, May 17, 1993, pp. 2554-2556.

Liu et al., "Selective Area Crystallization of Amorphous Silicon Films by Low-Temperature Rapid Thermal Annealing," Appl. Phys. Lett., vol. 55, No. 7, Aug. 14, 1989, pp. 660-662.

T. Hempel et al., "Needle-Like Crystallization of Ni Doped Amorphous Silicon Thin Films," Solid State Communications, vol. 85, No. 11 (1993), pp. 921-924.

J. Stoemenos et al., "Crystallization of Amorphous Silicon by Reconstructive Transformation Utilizing Gold," Appl. Phys. Lett., vol. 58, No. 11, Mar. 18, 1991, pp. 1196-1198.

C. Hayzelden et al., "Silicide Formation and Silicide-Mediated Crystallization of Nickel-Implanted Amorphous Silicon Thin Films," J. Appl. Phys., vol. 73, No. 12, Jun. 15, 1993, pp. 8279-8289.

Y. Kawazu et al., "Initial Stage of the Interfacial Reaction between Nickel and Hydrogentaed Amorphous Silicon," Japanese Journal of Applied Physics, vol. 29, No. 4, Apr. 1990, pp. 729-738.

L. Hultman et al., "Crystallization of Amorphous Silicon During Thin-Film Gold Reaction," J. Appl. Phys. 62(9), Nov. 1, 1987, pp. 3647-3655.

T. Balaji Suresh, et al., "Electroless Plates Nickel Contacts to Hydrogenated Amorphous Silicon," Thin Solid Films, 252 (1994), pp. 78-81.

M. Fuse et al., "Performance of Poly-Si Film Transistors Fabricated by Excimer-Laser Annealing of SiH4 and Si2H6-Source Low Pressure Vapor Deposited A Si Films with or Without Solid-Phase Crystallization," Solid State Phenomena, vols. 37-38 (1994), pp. 565-570.

S. Caune et al., "Combined SW Laser and Furnace Annealing of Amorphous Si and Ge in Contact with Some Metals," Applied Surface Science 36 (1989), North-Holland, Amsterdam, pp. 597-604.

* cited by examiner

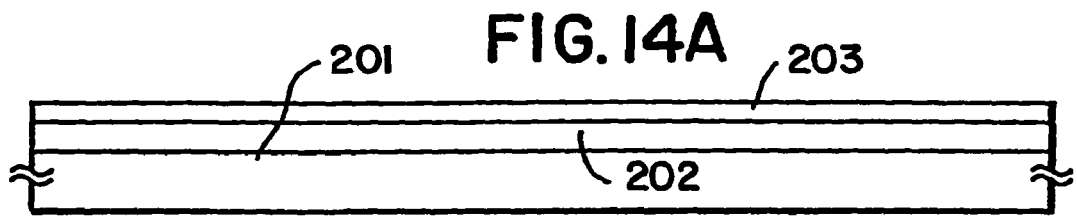
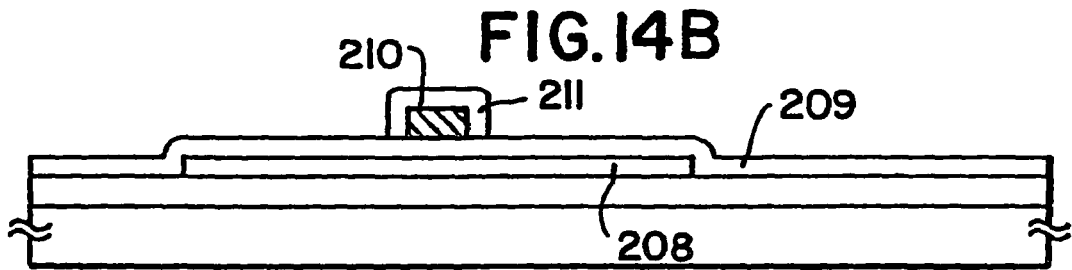
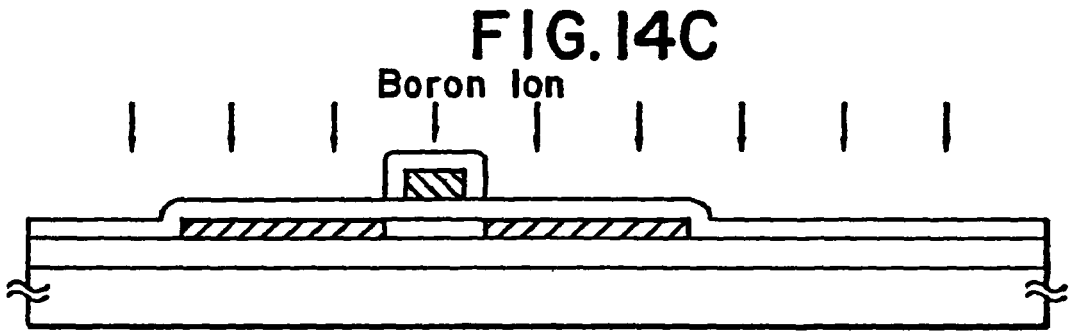
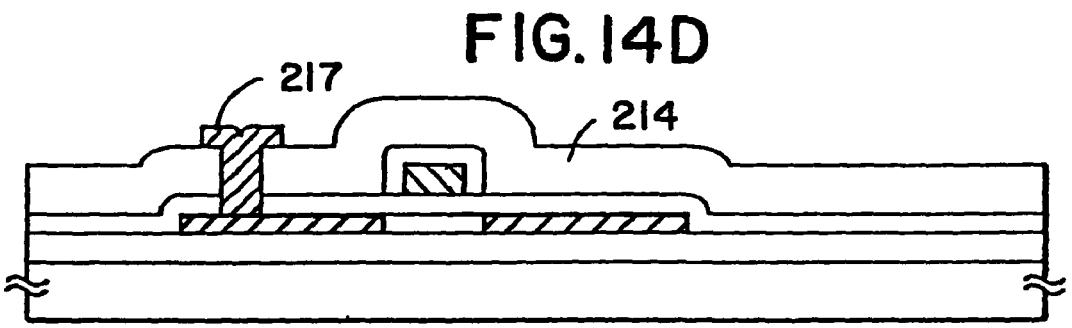
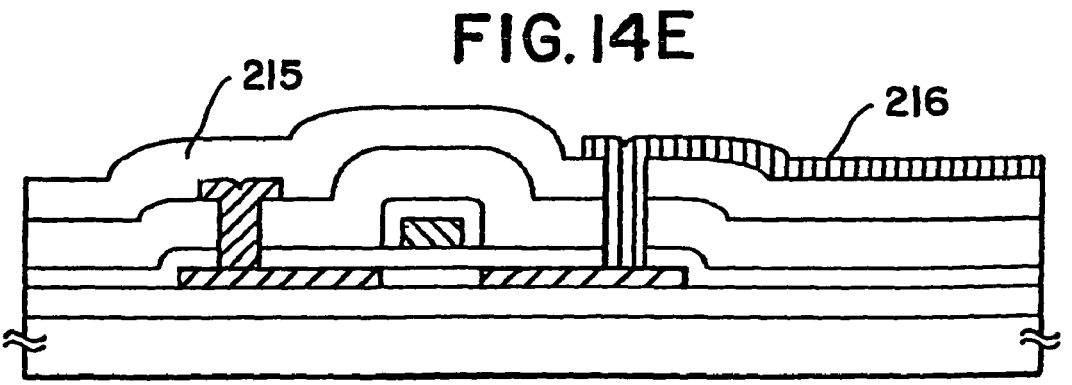

METHOD FOR MANUFACTURING A SEMICONDUCTOR DEVICE

BACKGROUND OF THE INVENTION

1. Field of the Invention

The present invention relates to a process for manufacturing a semiconductor device having a crystalline semiconductor. The present invention further relates to an electro-optical device such as an active matrix liquid crystal device using the semiconductor device.

2. Prior Art

Thin film transistors (referred to simply hereinafter as "TFTs") are well known and are widely used in various types of integrated circuits or an electro-optical device, and particularly used for switching elements provided to each of pixels of an active matrix(-addressed) liquid crystal display device as well as in driver elements of the peripheral circuits thereof.

An amorphous silicon film can be utilized most readily as the thin film semiconductor for a TFT. However, the electric characteristics of the amorphous silicon film are disadvantageously poor. The use of a thin film of polysilicon (polycrystalline silicon), which is a crystalline silicon, can solve the problem. Crystalline silicon is denoted as, for example, polycrystalline silicon, polysilicon, and microcrystalline silicon. The crystalline silicon film can be prepared by first forming an amorphous silicon film, and then heat treating the resulting film for crystallization.

The heat treatment for the crystallization of the amorphous silicon film requires heating the film at a temperature of 600° C. or higher for a duration of 10 hours or longer. Such a heat treatment is detrimental for a glass substrate. For instance, a Corning 7059 glass commonly used for the substrate of active matrix liquid crystal display devices has a glass distortion point of 593° C., and is therefore not suitable for large area substrates that are subjected to heating at a temperature of 600° C. or higher.

According to the study of the present inventors, it was found that the crystallization of an amorphous silicon film can be effected by heating the film at 550° C. for a duration of about 4 hours. This can be accomplished by disposing a trace amount of nickel or palladium, or other elements such as lead, onto the surface of the amorphous silicon film.

The elements above (hereinafter referred to as "catalyst elements capable of accelerating the crystallization of an amorphous silicon film" or simply as "catalyst elements") can be introduced into the surface of the amorphous silicon film by depositing the elements by plasma treatment or vapor deposition, or by incorporating the elements by ion implantation. The plasma treatment more specifically comprises adding the catalyst elements into the amorphous silicon film by generating a plasma in an atmosphere such as gaseous hydrogen or nitrogen using an electrode containing catalyst elements therein in a plasma CVD apparatus of a parallel plate type or positive columnar type.

However, the presence of the catalyst elements in a large quantity in the semiconductor is not preferred, because the use of such semiconductors greatly impairs the reliability and the electric stability of the device in which the semiconductor is used.

That is, the catalyst elements are necessary in the crystallization of the amorphous silicon film, but are preferably not incorporated in the crystallized silicon. These conflicting requirements can be accomplished by selecting an element which tend to be inactive in crystalline silicon as the catalyst element, and by incorporating the catalyst element at a minimum amount possible for the crystallization of the film. Accordingly, the quantity of the catalyst element to be incorporated in the film must be controlled with high precision.

The crystallization process using nickel or the like was studied in detail. The following findings were obtained as a result:

(1) In case of incorporating nickel by plasma treatment into an amorphous silicon film, nickel is found to intrude into the film to a considerable depth of the amorphous silicon film before subjecting the film to a heat treatment;

(2) The initial nucleation occurs from the surface from which nickel is incorporated; and (3) When a nickel layer is deposited on the amorphous silicon film, the crystallization of an amorphous silicon film occurs in the same manner as in the case of effecting plasma treatment.

In view of the foregoing, it is assumed that not all of the nickel introduced by the plasma treatment functions to promote the crystallization of silicon. That is, if a large amount of nickel is introduced, there exists an excess amount of the nickel which does not function effectively. For this reason, the inventors consider that it is a point or face at which the nickel contacts the silicon that functions to promote the crystallization of the silicon at lower temperatures. Further, it is assumed that the nickel has to be dispersed in the silicon in the form of atoms. Namely, it is assumed that nickel needs to be dispersed in the vicinity of a surface of an amorphous silicon film in the form of atoms, and the concentration of the nickel should be as small as possible but within a range which is sufficiently high to promote the low temperature crystallization.

A trace amount of nickel, i.e., a catalyst element capable of accelerating the crystallization of the amorphous silicon, can be incorporated in the vicinity of the surface of the amorphous silicon film by, for example, vapor deposition. However, vapor deposition is disadvantageous concerning the controllability of the film, and is therefore not suitable for precisely controlling the amount of the catalyst element to be incorporated in the amorphous silicon film.

SUMMARY OF THE INVENTION

In the light of the aforementioned circumstances, the present invention aims to fabricate with high productivity, a thin film of crystalline silicon semiconductor by a heat treatment at a relatively low temperature using a catalyst element, provided that the catalyst element is incorporated by precisely controlling the quantity thereof.

In accordance with one aspect of the present invention, the foregoing objects can be achieved by providing an amorphous silicon film with a catalytic element for promoting the crystallization thereof or a compound including the catalytic element in contact with the amorphous silicon film, and heat treating the amorphous silicon with said catalytic element or said compound being in contact therewith, thereby, the silicon film is crystallized.

More specifically, a solution containing the catalytic element is provided in contact with an amorphous silicon film in order to introduce the catalytic element into the amorphous silicon film.

It is another feature of the present invention to add a material selected from the group consisting of Ni, Pd, Pt, Cu, Ag, Au, In, Sn, P, As and Sb into a silicon semiconductor film at a trace amount by contacting a solution containing said material with the silicon film and then crystallize the silicon semiconductor film by heating at a relatively low temperature.

By utilizing the silicon film having a crystallinity thus formed, it is possible to form an active region including therein at least one electric junction such as PN, PI or NI junction. Examples of semiconductor devices are thin film transistors (TFT), diodes, photo sensor, etc.

BRIEF DESCRIPTION OF THE DRAWINGS

The foregoing objects and features of the present invention will be described in detail with reference to the attached figures in which:

FIGS. 14A-14E are cross sectional views showing a manufacturing process of a TFT in accordance with Example 8 of the present invention.

DETAILED DESCRIPTION OF THE INVENTION

Figure 1A:
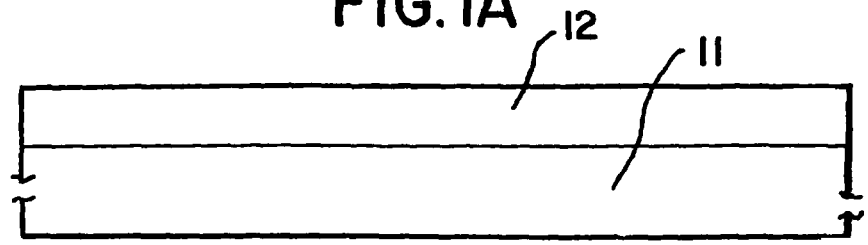
FIGS. 1A to 1D are cross sectional views for forming a crystalline silicon film in accordance with the present invention.
Figure 1B:
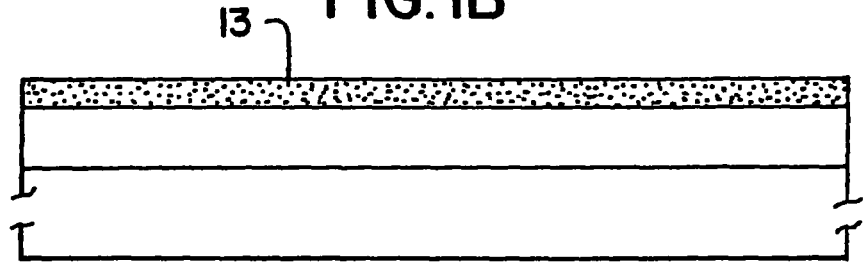

The use of a solution for adding nickel or the like according to the present invention is advantageous in the following points:

(a) The concentration of the catalyst element (e.g. nickel) in the solution can be accurately controlled in advance;

(b) The amount of the catalyst element incorporated into the amorphous silicon film can be determined by the concentration of the catalyst element in the solution so long as the surface of the amorphous silicon film is brought into contact with the solution; and (c) The catalyst element can be incorporated at a minimum concentration necessary for the crystallization into the amorphous silicon film, because the catalyst element adsorbed by the surface of the amorphous silicon film principally contributes to the crystallization of the film.

The word "including" or "containing" mentioned in the present specification may be understood as either (a) that the catalytic element is simply dispersed in a solution or (b) that the catalytic element is contained in a solution in a form of a compound. As a solution, various aqueous solutions and organic solvent solutions can be used. Those solvents can be roughly classified into a polar solvent and a non-polar solvent Water, alcohol, acid or ammonium can be used as a polar solvent. Examples of nickel compounds which are suitable for the polar solvent are nickel bromide, nickel acetate, nickel oxalate, nickel carbonate, nickel chloride, nickel iodide, nickel nitrate, nickel sulfate, nickel formate, nickel acetyl acetonate, 4-cyclohexyl butyric acid, nickel oxide and nickel hydroxide.

Also, benzene, toluene, xylene, carbon tetrachloride, chloroform or ether can be used as a non-polar solvent. Examples of nickel compounds suitable for a non-polar solvent are nickel acetyl acetonate and 2-ethyl hexanoic acid nickel.

Further, it is possible to add an interfacial active agent to a solution containing a catalytic element. By doing so, the solution can be adhered to and adsorbed by a surface at a higher efficiency. The interfacial active agent may be coated on the surface to be coated in advance of coating the solution.

Also, when using an elemental nickel (metal), it is necessary to use an acid to dissolve it.

In the foregoing examples, the nickel can be completely dissolved by the solvent. However, even if the nickel is not completely dissolved, it is possible to use a material such as an emulsion in which elemental nickel or nickel compound is dispersed uniformly in a dispersion medium.

When using a polar solvent such as water for dissolving nickel, it is likely that an amorphous silicon film repels such a solution. In such a case, a thin oxide film is preferably formed on the amorphous silicon film so that the solution can be provided thereon uniformly. The thickness of the oxide film is preferably 100 Å or less. Also, it is possible to add an interfacial active agent to the solution in order to increase a wetting property.

Further, it is possible to conduct a rubbing treatment on the surface of the thin oxide film in order to give the surface an irregularity with a uniform gap, width and direction. Such irregularity helps the solvent to permeate, thereby, increasing the uniformity of the size and directions of crystal grains. Also, such a crystalline semiconductor film in which crystals are oriented in a particular direction is advantageous to be used for a semiconductor device in order to increase a uniformity of device characteristics.

Also, when using a non-polar solvent such as toluene for obtaining a solution of 2-ethyl hexanoic acid nickel, the solution can be directly formed on the surface of an amorphous silicon film. However, it is possible to interpose between the amorphous silicon film and the solution a material for increasing the adhesivity therebetween, for example, OAP (containing hexamethyl disilazane as a main component, produced by Tokyo Oka Kogyo) which is used to increase adhesivity of a resist.

The concentration of the catalyst element in the solution depends on the kind of the solution, however, roughly speaking, the concentration of the catalyst element such as nickel by weight in the solution is 1 ppm to 200 ppm, and preferably, 1 ppm to 50 ppm, and more preferably 10 ppm or lower. The concentration is determined based on the nickel concentration in the silicon film or the resistance against hydrofluoric acid of the film upon completion of the crystallization.

The crystal growth can be controlled by applying the solution containing the catalyst element to a selected portion of the amorphous silicon film. In particular, the crystals can be grown in the silicon film by heating the silicon film in a direction approximately parallel with the plane of the silicon film from the region onto which the solution is directly applied toward the region onto which the solution is not applied.

It is also confirmed that this lateral growth region contains the catalyst element at a lower concentration. It is useful to utilize a crystalline silicon film as an active layer region for a semiconductor device, however, in general, the concentration of the impurity in the active region is preferably as low as possible. Accordingly, the use of the lateral growth region for the active layer region is useful in device fabrication.

The use of nickel as the catalyst element is particularly effective in the process according to the present invention. However, other useful catalyst elements include nickel (Ni), palladium (Pd), platinum (Pt), copper (Cu), silver (Ag), gold (Au), indium (In), tin (Sn), phosphorus (P), arsenic (As), and antimony (Sb). Otherwise, the catalyst element may be at least one selected from the elements belonging to the Group IIIa, IVa and Va of the periodic table.

EXAMPLE 1

The present example refers to a process for fabricating a crystalline silicon film on the surface of a glass substrate. Referring to FIGS. 1A-1D, the process for incorporating a catalyst element (nickel in this case) into the amorphous silicon film is described below. A Corning 7059 glass substrate 100 mm×100 mm in size is used An amorphous silicon film from 100 to 1,500 Å in thickness is deposited by plasma CVD or LPCVD. More specifically in this case, an amorphous silicon film 12 is deposited at a thickness of 1,000 A by plasma CVD (FIG. 1A).

Then, the amorphous silicon film is subjected to hydrofluoric acid treatment to remove impurities and a natural oxide formed thereon, if necessary. This treatment is followed by the deposition of an oxide film 13 on the amorphous silicon film to a thickness of from 10 to 50 Å. A natural oxide film may be utilized as the oxide film. The precise thickness of the oxide film 13 is not available because the film is extremely thin. However, the natural oxide film is assumably about 20 A in thickness. The oxide film 13 is deposited by irradiating an ultraviolet (UV) radiation in an oxygen atmosphere for a duration of 5 minutes. The oxide film 13 can be formed otherwise by thermal oxidation. Furthermore, the oxide film can be formed by a treatment using aqueous hydrogen peroxide.

The oxide film 13 is provided with an aim to fully spread the acetate solution containing nickel, which is to be applied in the later step, on the entire surface of the amorphous silicon film. More briefly, the oxide film 13 is provided for improving the wettability of the amorphous silicon film. If the aqueous acetate solution were to be applied directly, for instance, the amorphous silicon film would repel the aqueous acetate solution to prevent nickel from being incorporated uniformly into the surface of the amorphous silicon film.

Figure 1C:
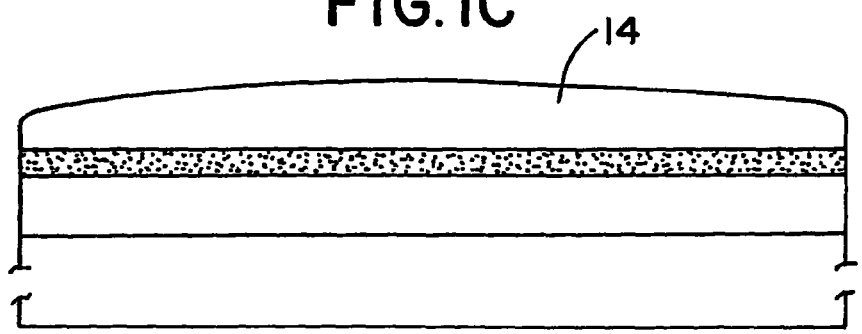
Figure 1D:
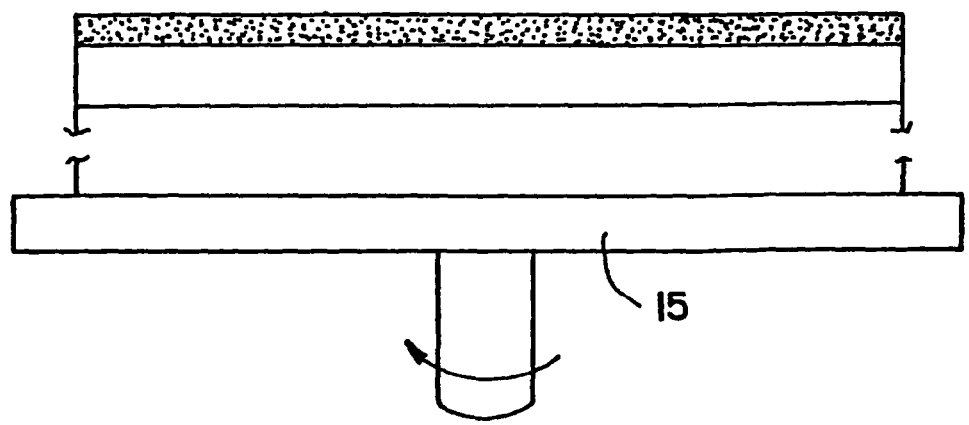

An aqueous acetate solution containing nickel added therein is prepared thereafter. More specifically, an aqueous acetate solution containing nickel at a concentration of 10 to 200 ppm, e.g. 100 ppm, is prepared. Two milliliters of the resulting acetate solution is dropped to the surface of the oxide film 13 on the amorphous silicon film 12, and is maintained as it is for a predetermined duration of time, preferably for a duration of 0.5 minutes or longer, e.g. for a duration of 5 minutes. Spin drying at 2,000 rpm using a spinner is effected for 60 seconds thereafter to remove the unnecessary solution (FIGS. 1C and 1D).

The concentration of nickel in the acetate solution is practically 1 ppm or more, preferably, 10 ppm or higher. The solution needs not be only an acetate solution, and other applicable solutions include those of hydrochlorides, nitrates, and sulfates. Otherwise, those of organic octylates and toluene can be used as well. In case of using the organic solutions, the oxide film 13 need not be incorporated because the solution can be directly applied to the amorphous silicon film to introduce the catalyst elements into the film.

The coating of the solution is carried out at one time or may be repeated, thereby, it is possible to form a film containing nickel on the surface of the amorphous silicon film 12 uniformly to a thickness of several angstrom to several hundreds angstrom after the spin dry. The nickel contained in this film will diffuse into the amorphous silicon film during a heating process carried out later and will function to promote the crystallization of the amorphous silicon film. By the way, it is the inventors' intention that the film containing nickel or other materials do not necessarily have to be in the form of a completely continuous film, that is, it may be discontinuous, for example, in the form of number of clusters.

The amorphous silicon film coated with one of the above solutions is kept as it is thereafter for a duration of 5 minutes. The final concentration of nickel catalyst element in the crystallized silicon film 12 can be controlled by changing this retention time, however, the most influencing factor in controlling the final concentration of nickel catalyst element in the crystallized silicon film is the concentration of the nickel catalyst element in the solution.

The silicon film coated with a nickel-containing solution thus obtained is subjected to heat treatment at a temperature of 550° C. for a duration of 4 hours in a nitrogen atmosphere in a beating furnace. Thus, a thin film of crystalline silicon 12 is formed on the substrate 11.

The heat treatment can be effected at any temperature of 450° C. or higher. If a low temperature is selected, however, the heat treatment would consume much time and result in a poor production efficiency. If a heat treatment temperature of 550° C. or higher were to be selected, on the other hand, the problem of heat resistance of the glass substrate must be considered.

EXAMPLE 2

The present example refers to a process similar to that described in Example 1, except that a silicon oxide film 1,200 A in thickness is provided selectively to incorporate nickel into selected regions of the amorphous silicon film using the silicon oxide film as a mask.

Figure 2A:
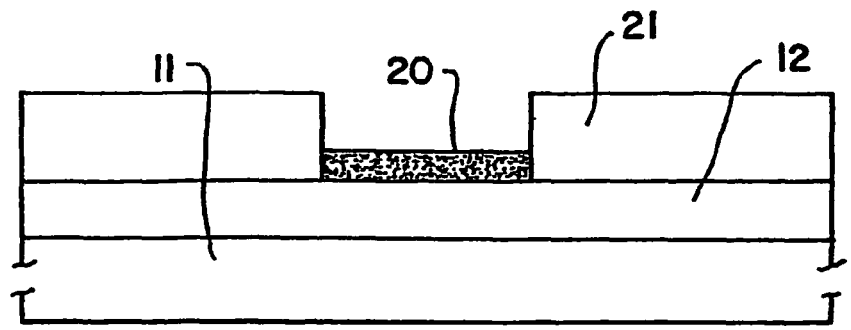
FIGS. 2A-2C are cross sectional views showing a formation of a crystalline silicon film in accordance with the present invention.
Figure 2B:
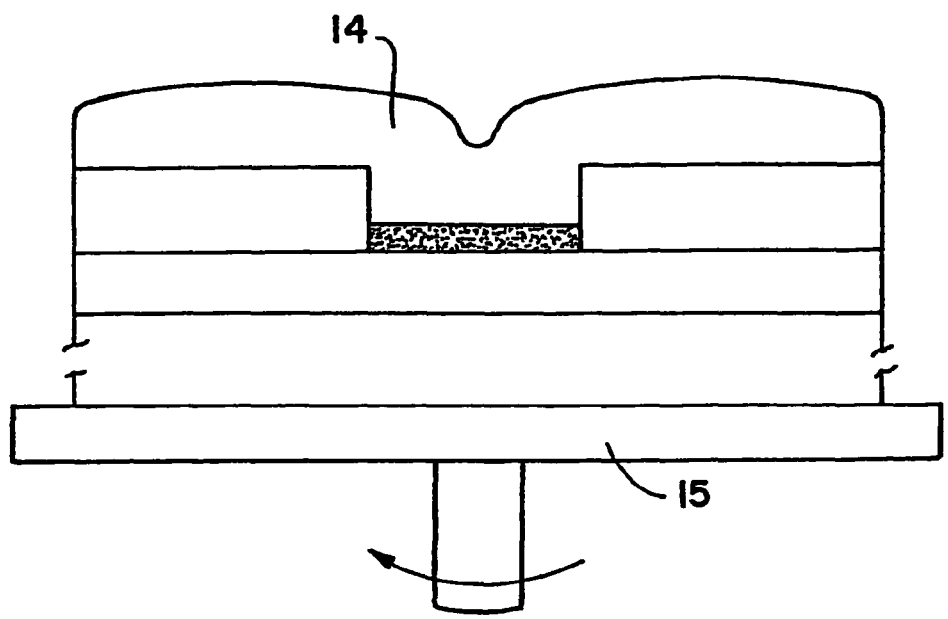
Figure 2C:
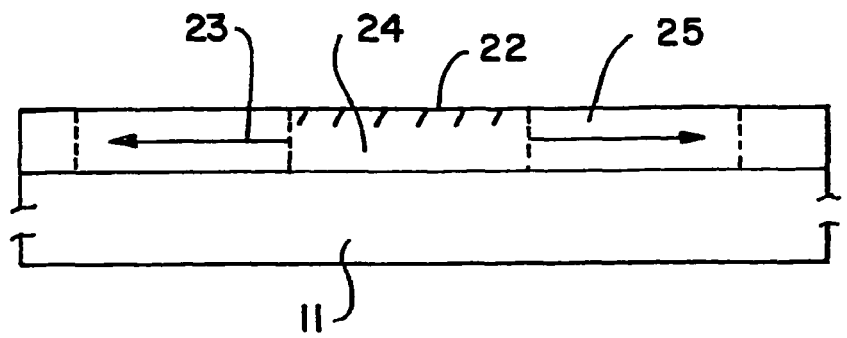

Referring to FIGS. 2A to 2C, the process for fabricating a semiconductor according to the present example is described below. A silicon oxide film is deposited to a thickness of 1,000 Å or more e.g. 1200 A as a mask on an amorphous silicon film 12. The silicon oxide film 21, however, may be thinner than 1000, e.g. 500 A if the film is sufficiently dense as a mask. The silicon oxide film 21 is patterned into a predetermined pattern thereafter by means of a conventional photolithography technique. A thin silicon oxide film 20 is formed by irradiating a UV radiation in oxygen atmosphere for 5 minutes. The thickness of the silicon oxide film 20 is presumably from about 20 to 50 A (FIG. 2A). The function of the silicon oxide film thus formed for improving the wettability of the amorphous silicon film might be occasionally provided by the hydrophilic nature of the silicon oxide film formed as the mask in case the solution is matched with the size of the mask pattern. However, this is a special case, and, in general, a silicon oxide film 20 is safely used.

Then, similar to the process described in Example 1, 5 milliliters (with respect to a substrate 10 cm×10 cm in size) of an acetate solution containing 100 ppm of nickel is dropped to the surface of the resulting structure. A uniform aqueous film is formed on the entire surface of the substrate by effecting spin coating using a spinner at 50 rpm for a duration of 10 seconds. Then, after maintaining the state for a duration of 5 minutes, the resulting structure is subjected to spin drying using a spinner at a rate of 2,000 rpm for a duration of 60 seconds. During the retention time, the substrate may be rotated on the spinner at a rate of 100 rpm or lower (FIG. 2B).

The amorphous silicon film 12 is crystallized thereafter by applying heat treatment at 550° C. for a duration of 4 hours in gaseous nitrogen. It can be seen that the crystal growth proceeds along a lateral direction from the region 22 into which nickel is introduced as shown by arrow 23 toward the region 25 into which nickel is not directly introduced.

In FIG. 2C, the reference numeral 24 shows a region in which the nickel is directly introduced to cause the crystallization and the reference numeral 25 shows a region in which the crystallization proceeds laterally from the region 24.

It was confirmed through transmission electron microscopy (TEM) and electron diffraction that:

(a) the crystals grown in a lateral direction are monocrystalline in the form of needle or column having uniform widths;

(b) the growth direction of the crystals are approximately parallel with the substrate surface although it depends upon the film thickness; and (c) the growth direction of the crystals are substantially aligned with the [111] axis of the crystals.

From the foregoing facts, it can be concluded that the surface of the lateral growth region 25 has a plane at least one of those expressed by {hkl} (h+k=l), for example, {110}, {123}, {134}, {235}, {145}, {156}, {257}, or {167}, or the neighborhood thereof.

It should be noted that since crystalline silicon has a diamond structure of which space group is indicated by Fd3m, when the above index hkl is even-odd mixing, a forbidden reflection occurs and it can not be observed with the electron diffraction.

Figure 3:
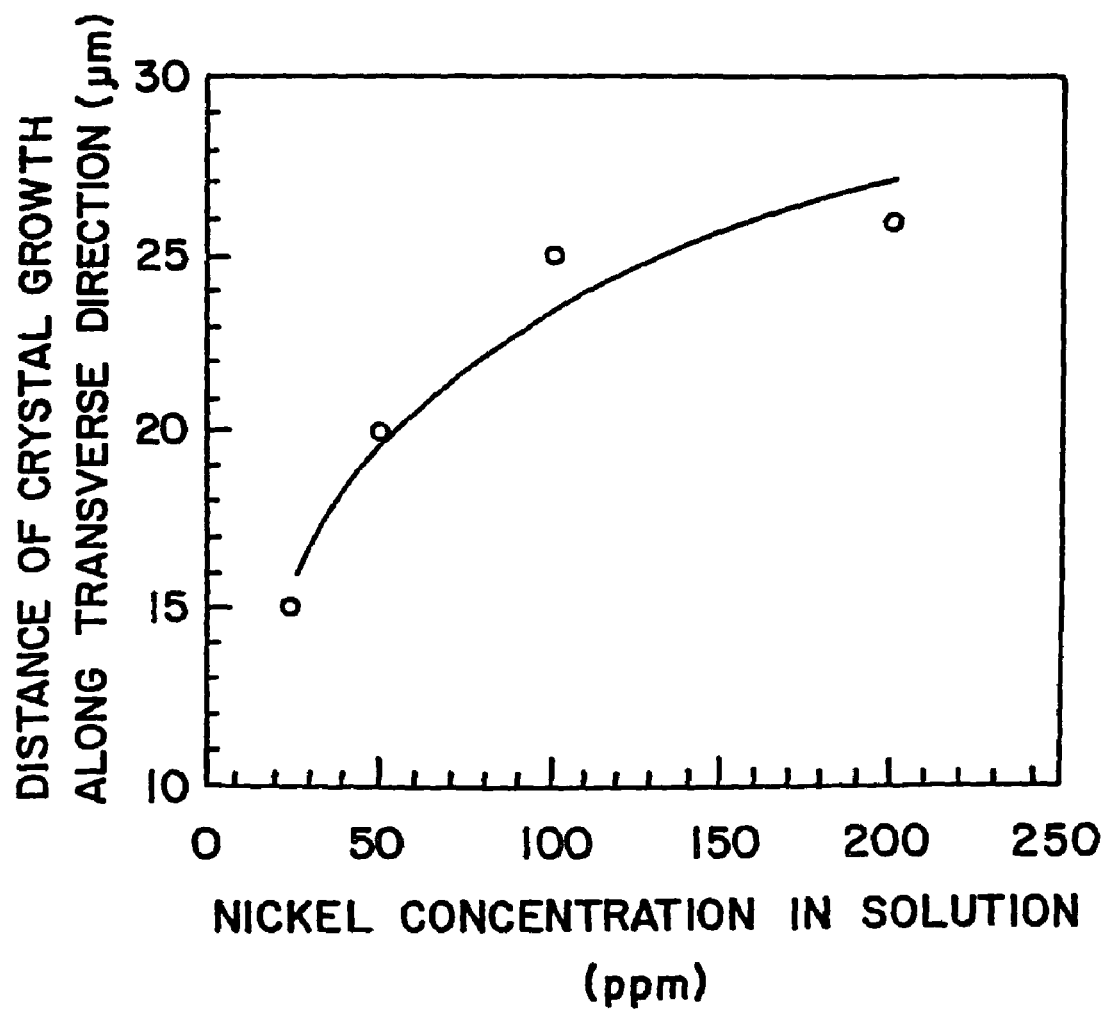
FIG. 3 is a graph showing a relation of a lateral growth length of crystals with respect to a concentration of nickel in a solution.

FIG. 3 shows the relation between the distance (μm) of the crystal growth to the region 23 along the transverse (lateral) direction and the nickel concentration (ppm) in the aqueous acetate solution.

FIG. 3 reads that a crystal growth for a distance of 25 μm or longer can be realized by preparing a solution containing nickel at a concentration of 100 ppm or higher. It can be also assumed from FIG. 3 that a crystal growth along the lateral direction of about 10 μm can be obtained by using an aqueous acetate solution containing nickel at a concentration of 10 ppm.

The datum plotted in FIG. 3 are for the case that the structure was held for a duration of 5 minutes after applying the nickel-containing aqueous acetate solution. However, the distance of crystal growth along the lateral direction changes with the retention time.

In case of using an aqueous acetate solution containing nickel at a concentration of 100 ppm, for instance, longer distance of crystal growth can be obtained with increasing retention time up to 1 minute. However, once a retention time of 1 minute or longer is set, the further increase becomes insignificant.

In case an aqueous acetate solution containing nickel at a concentration of 50 ppm is used, the retention time increases proportional to the distance of the crystal growth along the lateral direction. However, the increment tends to saturate with increasing retention time to 5 minutes or longer.

Furthermore, it should be noted that temperature greatly influences the time necessary for a reaction to achieve an equilibrium. Accordingly, the retention time is also subject to the temperature, and a strict control of the temperature is indispensable. Thus, the distance of crystal growth can be increased in total by elevating the temperature of heat treatment and by elongating the duration of the beat treatment.

Figure 4:
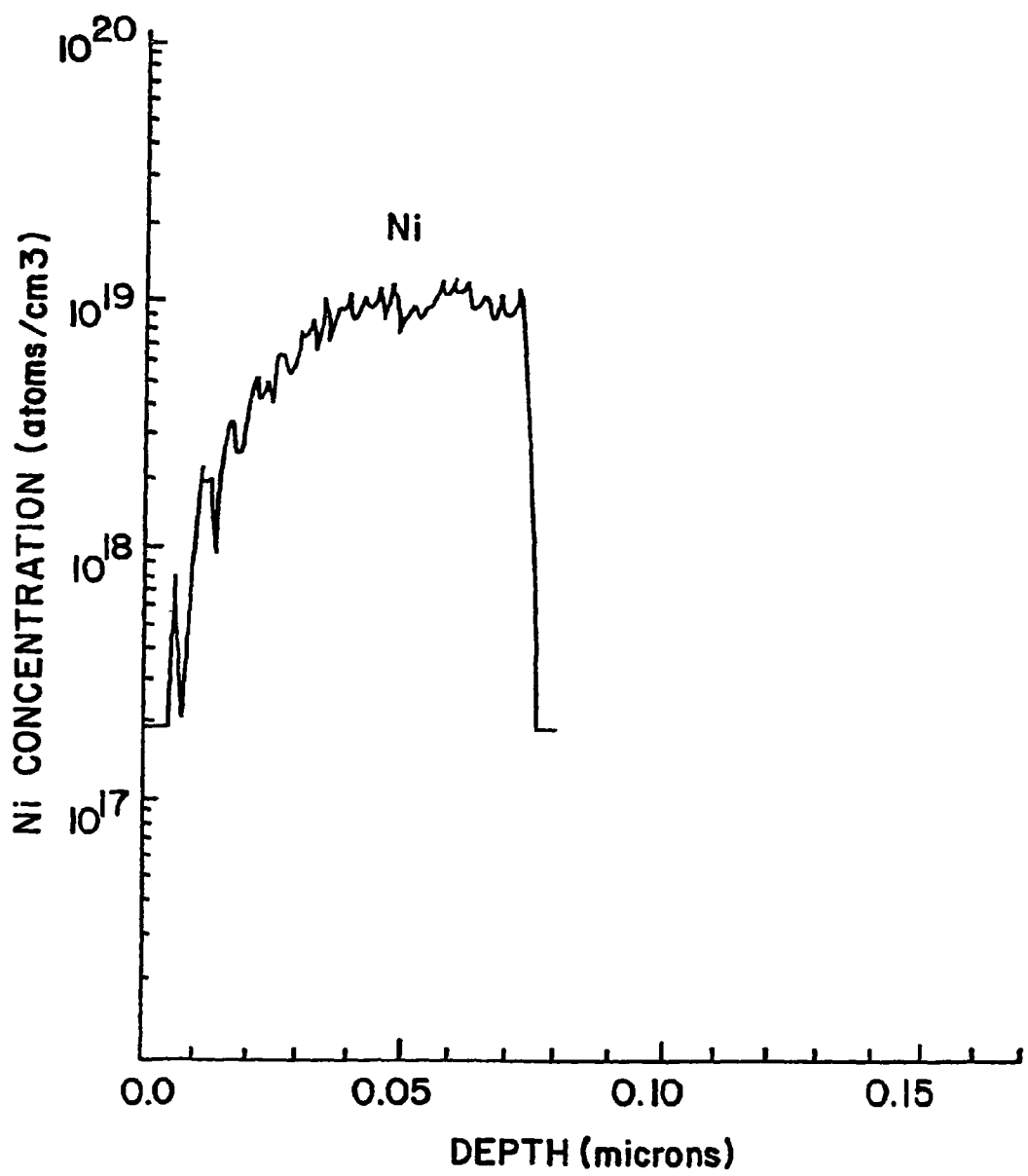
FIG. 4 is a graph showing a SIMS data with respect to nickel in a silicon region into which nickel is directly added.
Figure 5:
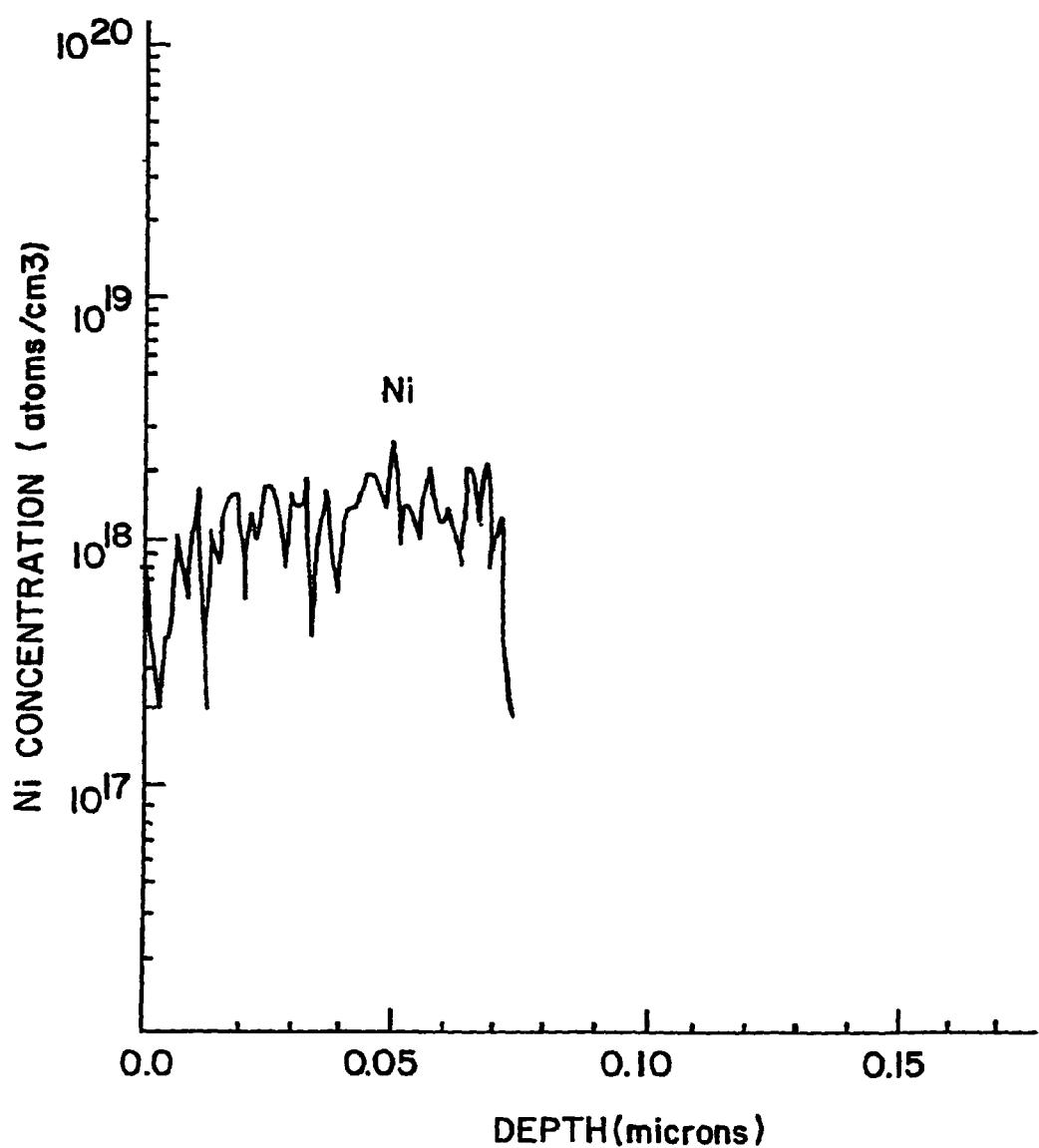
FIG. 5 is a graph showing a SIMS data with respect to nickel in a silicon region where crystals grow along the lateral direction from the region into which nickel is directly added.

FIGS. 4 and 5 show the nickel concentration in a silicon film obtained by introducing nickel using an aqueous acetate solution containing 100 ppm nickel and thereafter heat treating the silicon film at 550° C. for a duration of 4 hours. The nickel concentration is obtained by secondary ion mass spectroscopy (SIMS).

FIG. 4 shows the nickel concentration of the region 24 shown in FIG. 2C, i.e., the region into which nickel is directly incorporated. FIG. 5 shows the nickel concentration of the region 25 in FIG. 2C, i.e., the region in which crystal growth occurred along the lateral direction from the region 22.

By comparing the data of FIG. 4 with that of FIG. 5, it can be seen that the nickel concentration of the region in which the crystal growth occurs along the lateral direction is lower by about one digit as compared with that of the region into which nickel is introduced directly.

It can be seen also that the nickel concentration in the crystallized silicon film in the region into which nickel is introduced directly can be suppressed to a level of $10^{18}$ cm$^{-3}$ by using an aqueous acetate solution containing nickel at a concentration of 10 ppm.

Conclusively, it is understood that the nickel concentration in the crystalline silicon region in which the crystal growth occurs along the lateral direction can be suppressed to $10^{17}$ cm$^{-3}$ or lower by using an aqueous acetate solution containing nickel at a concentration of 10 ppm and effecting the heat treatment at 550° C. or higher for a duration of 4 hours or longer.

In conclusion, it is possible to control the concentration of nickel in the region 24 of the silicon film where the nickel is directly added within a range of $1\times10^{16}$ atoms/cm$^3$ to $1\times10^{19}$ atoms/cm$^3$ by controlling the density of the solution and the retention time and further to maintain the concentration of the nickel in the lateral growth region 25 below that.

Figure 7:
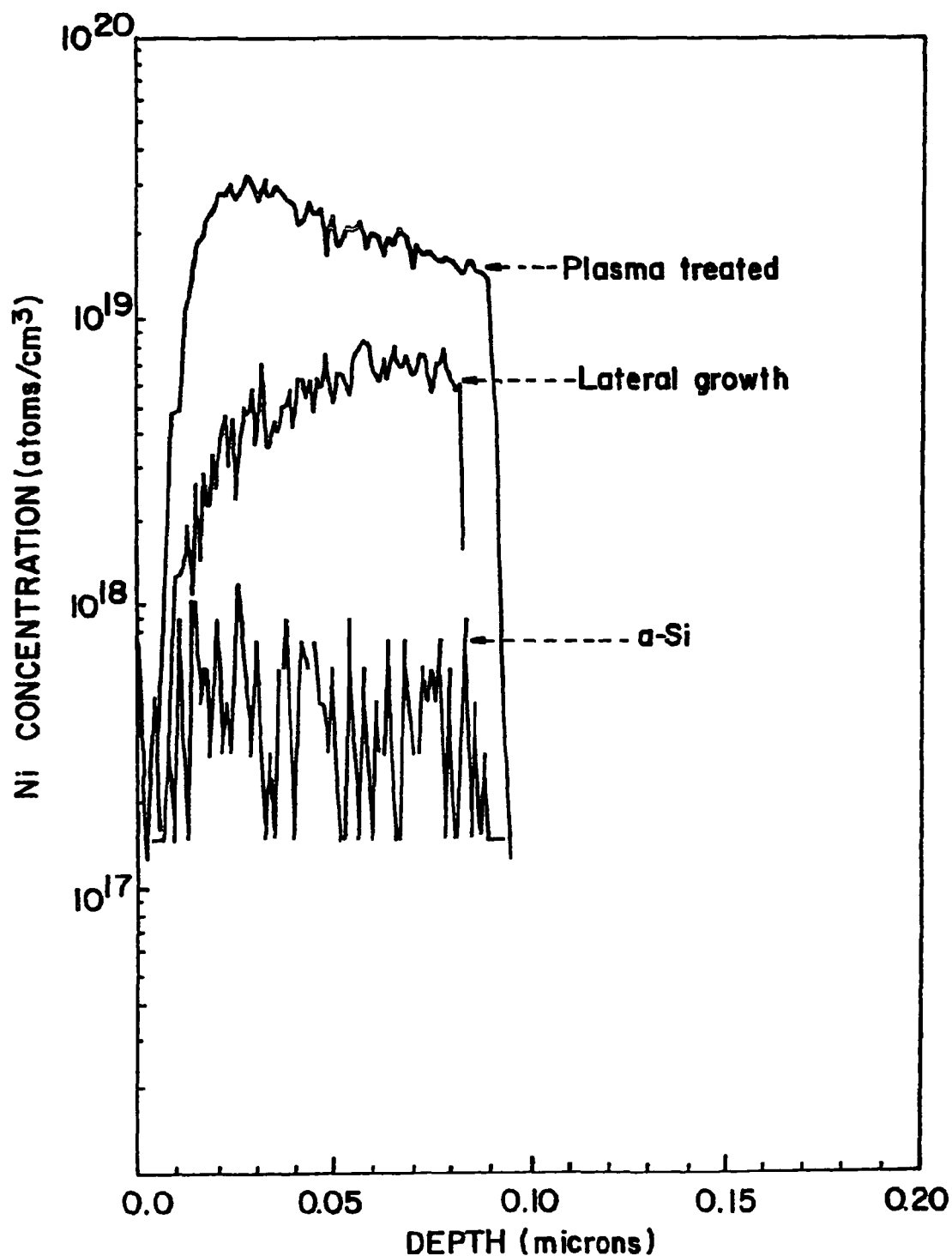
FIG. 7 shows a Ni concentration in a silicon film subjected to a plasma treatment.

For comparison, a sample is prepared through a process in which, instead of using a nickel containing solution, an amorphous silicon film is exposed to a plasma which is produced by using an electrode containing an amount of nickel in order to add the nickel into the silicon (this is called as a plasma treatment), and further the silicon film is crystallized by a heat annealing at 550° C. for 4 hours. The condition of the plasma treatment is selected so that the same degree of a lateral crystal growth can be obtained as in the case where an acetic acid containing nickel at 100 ppm is used. The SIMS data with respect to this sample is shown in FIG. 7. As can be seen, in the case of using a plasma treatment, the nickel concentration in the lateral growth region is higher than $5\times10^{18}$ atoms/cm$^3$ which is undesirably high for an active region of a semiconductor device. Accordingly, it is to be understood that the use of a solution is advantageous for minimizing the concentration of the nickel in the lateral growth region.

Figure 8:
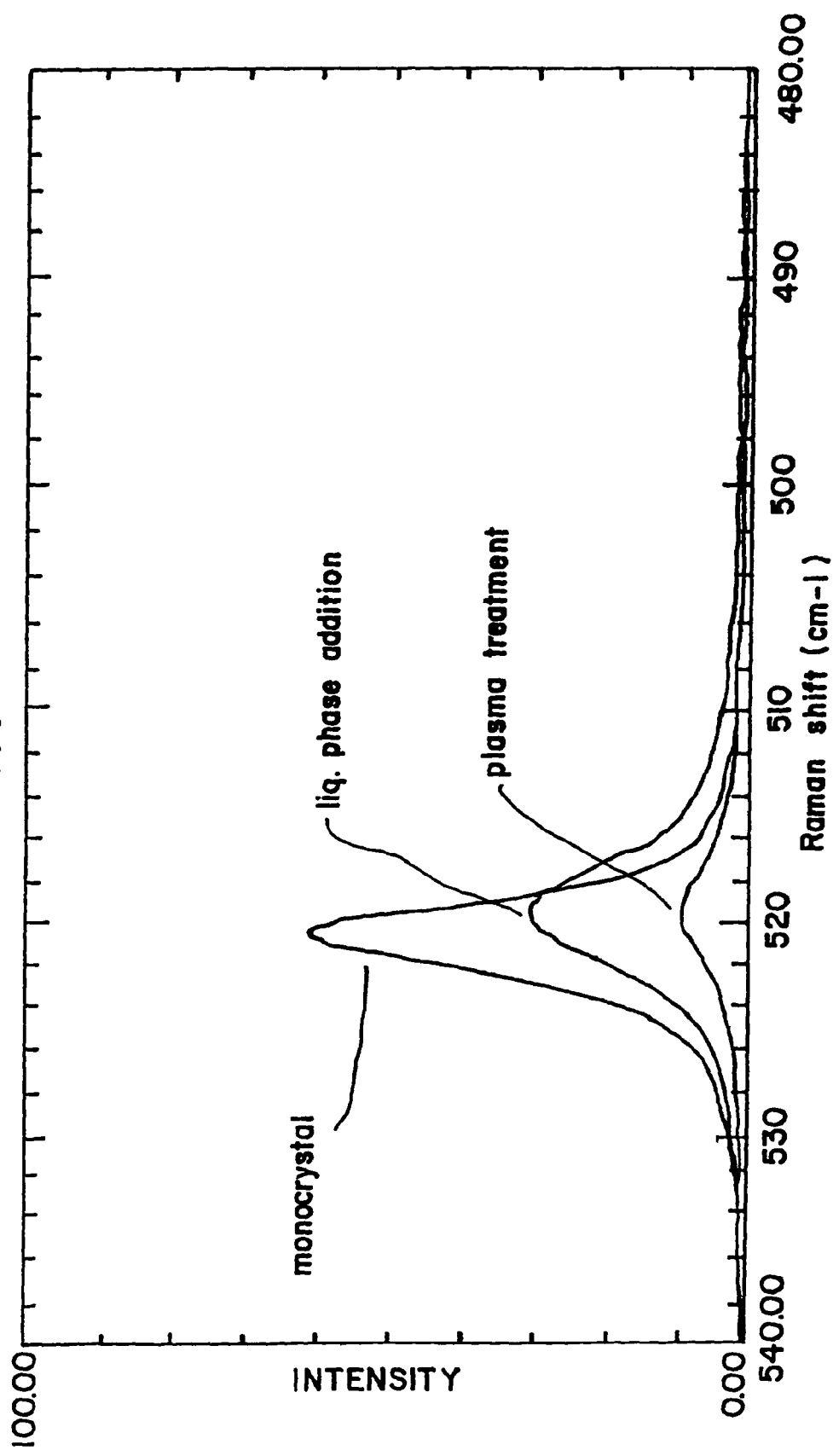
FIG. 8 is a Raman spectroscopic diagram with respect to a region into which nickel is directly added.
Figure 9:
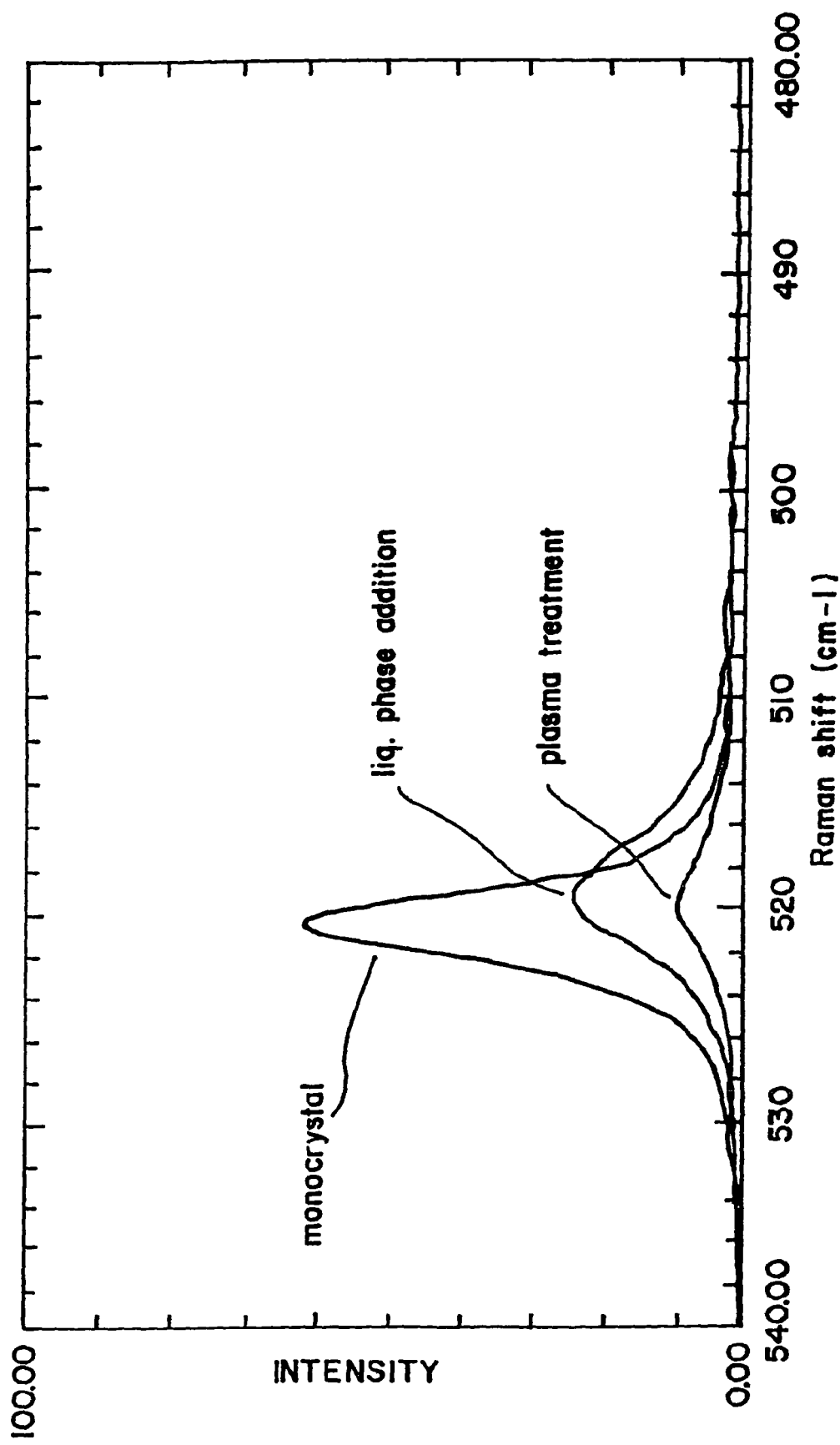
FIG. 9 is a Raman spectroscopic diagram with respect to a region where crystals grow in a lateral direction.

FIG. 8 shows a result of Raman spectroscopy with respect to the region corresponding to FIG. 4, namely, the region where the nickel is directly introduced. FIG. 8 indicates that the crystallinity in this region is extremely high. Also, FIG. 9 shows a result of Raman spectroscopy with respect to the region where the crystal grows laterally. As can be seen, even in the lateral growth area, the intensity of the Raman spectrum is more than ⅓ of the intensity of the single crystal silicon. Accordingly, it is concluded that the crystallinity in the lateral growth region is also high.

The crystalline silicon film thus fabricated by the process according to the present invention is characterized in that it exhibits an excellent resistance against hydrofluoric acid. To the present inventors' knowledge, if the nickel is introduced by a plasma treatment, the resistivity of the crystallized silicon against a hydrofluoric acid is poor. When it is necessary to pattern a silicon oxide film which is formed over the crystalline silicon film for forming a contact hole therethrough, a hydrofluoric acid is usually used as an etchant. If the crystalline silicon film has a sufficiently high resistance against the hydrofluoric acid, a large selection ratio (the difference in the etching rate of the silicon oxide film and the crystalline silicon film) can be objected so as to remove the silicon oxide film alone. Accordingly, a crystalline silicon film having high resistance against attack of hydrofluoric acid is of great advantage in the fabrication process of a semiconductor device.

EXAMPLE 3

The present example relates to a process for fabricating TFTs which are provided to each of the pixels of an active matrix liquid crystal display device, using a crystalline silicon film fabricated by the process according to the present invention. The TFT's thus obtained can be applied not only to liquid crystal display devices, but also to a wide field generally denoted as thin film integrated circuits (ICs).

Referring to FIGS. 6A to 6E, the process for fabricating a TFT according to the present example is described below. A silicon oxide film (not shown in the figure) is deposited to a thickness of 2,000 Å as a base coating on a glass substrate. This silicon oxide film is provided to prevent the diffusion of impurities into the device structure from the glass substrate.

An amorphous silicon film is deposited thereafter to a thickness of 1,000 Å in a manner similar to that used in Example 1. After removing the natural oxide film by a treatment using hydrofluoric acid, a thin film of an oxide film is formed to a thickness of about 20 Å by means of UV irradiation under a gaseous oxygen atmosphere.

The resulting amorphous silicon film having the oxide film thereon is coated with an aqueous acetate solution containing nickel at a concentration of 10 ppm. The resulting structure is retained for a duration of 5 minutes, and is subjected thereafter to spin drying using a spinner. The silicon oxide film is removed thereafter using a buffered hydrofluoric acid, and a silicon film is crystallized by heating the resulting structure at 550° C. for a duration of 4 hours. The process up to this step is the same as that described in Example 1.

Figure 6A:
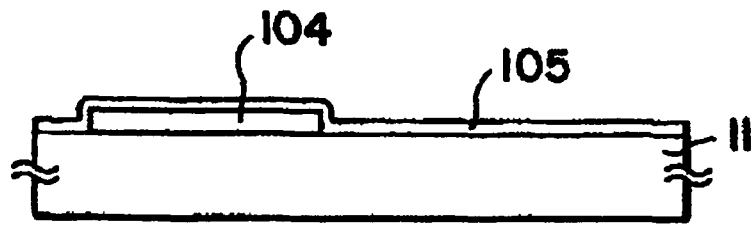
FIGS. 6A to 6E show cross sectional views showing a manufacturing process of a semiconductor device in accordance with Example 3 of the present invention.

The silicon film thus crystallized is patterned to form an island-like region 104 as shown in FIG. 6A. The island-like region 104 provides the active layer for the TFT. A silicon oxide film 105 is formed thereafter for a thickness of from 200 to 1,500 Å at a thickness of 1,000 Å. The silicon oxide film functions as a gate insulating film (FIG. 6A).

The silicon oxide film 105 is deposited by means of RF plasma CVD process using TEOS (tetraethoxysilane). That is, TEOS is decomposed and then deposited together with oxygen at a substrate temperature of 150 to 600° C., preferably in the range of 300 to 450° C. TEOS and oxygen are introduced at a pressure ratio of 1:1 to 1:3 under a total pressure of 0.05 to 0.5 Torr, while applying an RF power of 100 to 250 W. Otherwise, the silicon oxide film can be fabricated by reduced pressure CVD or normal pressure CVD using TEOS as the starting gas together with gaseous ozone, while maintaining the substrate temperature in the range of from 350 to 600° C., preferably, in the range of from 400 to 550° C. The film thus deposited is annealed in oxygen or under ozone in the temperature range from 400 to 600° C. for a duration of from 30 to 60 minutes.

The crystallization of the silicon region 104 can be accelerated by irradiating a laser beam using a KrF excimer laser (operating at a wavelength of 248 nm at a pulse width of 20 nsec) or an intense light equivalent thereto. The application of RTA (rapid thermal annealing) using infrared radiation is particularly effective because the silicon film can be heated selectively without heating the glass substrate. Moreover, RTA is especially useful in the fabrication of insulated gate field effect semiconductor devices because it decreases the interface level between the silicon layer and the silicon oxide film.

Figure 6B:
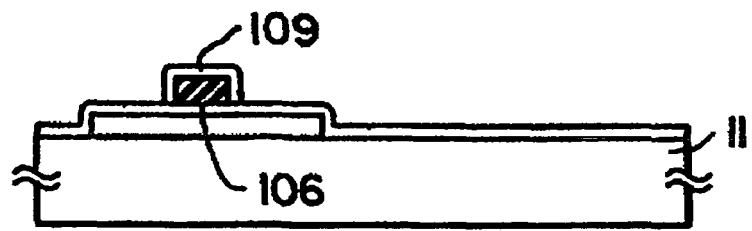
Figure 6C:
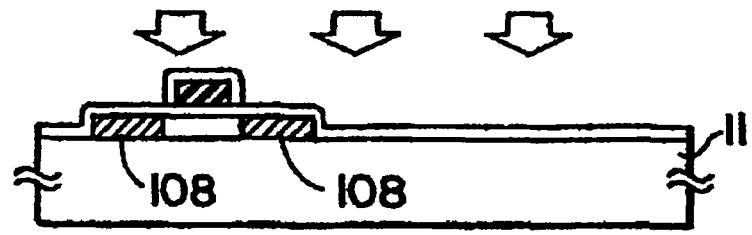

Subsequently, an aluminum film is deposited to a thickness of from 2,000 Å to 1 μm by electron beam vapor deposition, and is patterned to form a gate electrode 106. The aluminum film may contain from 0.15 to 0.2% by weight of scandium as a dopant. The substrate is then immersed into an ethylene glycol solution controlled to a pH of about 7 and containing 1 to 3% tartaric acid to effect anodic oxidation using platinum as the cathode and the aluminum gate electrode as the anode. The anodic oxidation is effected by first increasing the voltage to 220 V at a constant rate, and then holding the voltage at 220 V for 1 hour to complete the oxidation. In case a constant current is applied as in the present case, the voltage is preferably increased at a rate of from 2 to 5 V/minute. An anodic oxide 109 is formed at a thickness of from 1,500 to 3,500 Å, more specifically, at a thickness of, for example, 2,000 Å in this manner (FIG. 6B).

Impurities (specifically in this case, phosphorus) are implanted into the island-like silicon film of the TFT in a self-aligned manner by ion doping (plasma doping) using the gate electrode portion as a mask. Phosphine ($PH_3$) is used as a doping gas to implant phosphorus at a dose of from $1 \times 10^{15}$ to $4 \times 10^{15}$ $cm^{-2}$.

The crystallinity of the portion whose crystallinity is impaired by the introduction of impurities is cured by irradiating a laser beam using a KrF excimer laser operating at a wavelength of 248 nm and a pulse width of 20 nsec. The laser is operated at an energy density of from 150 to 400 $mJ/cm^2$, preferably, in a range from 200 to 250 $mJ/cm^2$. Thus are formed N-type impurity regions (regions doped with phosphorus) 108. The sheet resistance of the regions is found to be in the range of 200 to 800 Ω/square.

This step of laser annealing can be replaced by an RTA process, i.e., a rapid thermal annealing process using a flash lamp, which comprises elevating the temperature of the silicon film rapidly to a range of from 1,000 to 1,200° C. (as measured on the silicon monitor). This method of annealing is also called as RTP (rapid thermal process).

Figure 6D:
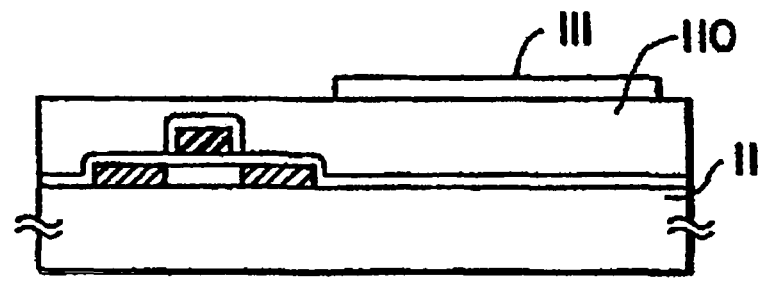

A silicon oxide film is deposited thereafter to a thickness of 3,000 Å as an interlayer dielectric 110 by means of plasma CVD using TEOS together with oxygen, or by means of reduced pressure CVD or normal pressure CVD using TEOS together with ozone. The substrate temperature is maintained in the range of 250 to 450° C., for instance, at 350° C. A smooth surface is obtained thereafter by mechanically polishing the resulting silicon oxide film. An ITO coating is deposited thereon by sputtering, and is patterned to provide a pixel electrode 111 (FIG. 6D).

Figure 6E:
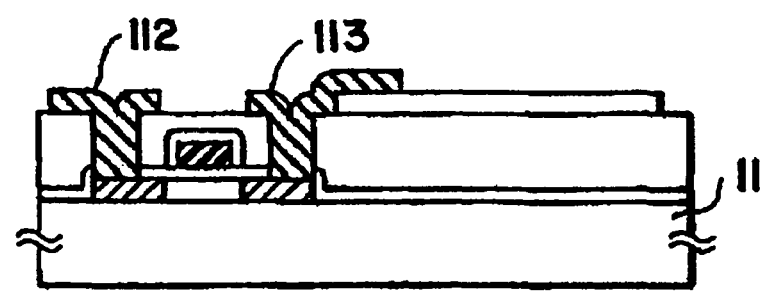

The interlayer dielectric 110 is etched to form contact holes in the source/drain as shown in FIG. 6E, and interconnections 112 and 113 are formed using chromium or titanium nitride to connect the interconnection 113 to the pixel electrode 111.

In the process according to the present invention, nickel is incorporated into the silicon film by using an aqueous solution containing nickel at such a low concentration of 10 ppm. Accordingly, a silicon film having a high resistance against hydrofluoric acid can be realized and contact holes can be formed stably and with high reproducibility.

A complete TFT can be formed by finally annealing the silicon film in hydrogen in a temperature range of 300 to 400° C. for a duration of from 0.1 to 2 hours to accomplish the hydrogenation of the silicon film. A plurality of TFTs similar to the one described hereinbefore are fabricated simultaneously, and are arranged in a matrix to form an active matrix liquid crystal display device.

In accordance with the present example, the concentration of the nickel contained in the active layer is in the range of $5 \times 10^{16}$ to $3 \times 10^{18}$ atoms/cm$^3$.

As described above, the process according to the present example comprises crystallizing the portion into which nickel is introduced. However, the process can be modified as in Example 2. That is, nickel can be incorporated to selected portions through a mask, and crystals may be allowed to grow from the portions in a lateral direction. This region of crystal growth is used for the device. A device far more preferred from the viewpoint of electric stability and reliability can be realized by further lowering the nickel concentration of the active layer region of the device.

EXAMPLE 4

This example is directed to a manufacture of a TFT used to control a pixel of an active matrix. FIGS. 10A-10F are cross sectional views for explaining the manufacture of the TFT in accordance with this example.

Figure 10A:
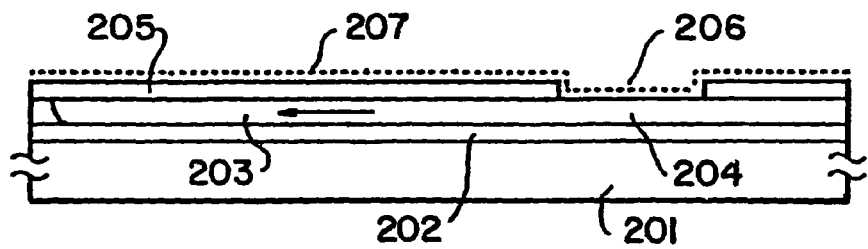
FIGS. 10A-10F are cross sectional views showing a manufacturing process of an electro-optical device in accordance with Example 4 of the present invention.

Referring to FIG. 10A, a substrate 201, for example glass substrate, is washed and provided with a silicon oxide film 202 on its surface. The silicon oxide film 202 is formed through a plasma CVD with oxygen and tetraethoxysilane used as starting gases. The thickness of the film is 2000 Å, for example. Then, an amorphous silicon film 203 of an intrinsic type having a thickness of 500-1500 Å, for example, 1000 Å is formed on the silicon oxide film 202, following which a silicon oxide film 205 of 500-2000 Å, for example 1000 Å is formed on the amorphous silicon film successively. Further, the silicon oxide film 205 is selectively etched in order to form an opening 206 at which the amorphous silicon film is exposed.

Then, a nickel containing solution (an acetic acid salt solution here) is coated on the entire surface in the same manner as set forth in Example 2. The concentration of nickel in the acetic acid salt solution is 100 ppm. The other conditions are the same as in Example 2. Thus, a nickel containing film 207 is formed.

The amorphous silicon film 203 provided with the nickel containing film in contact therewith is crystallized through a heat annealing at 500-620° C. for 4 hours in a nitrogen atmosphere. The crystallization starts from the region under the opening 206 where the silicon film directly contacts the nickel containing film and further proceeds in a direction parallel with the substrate. In the figure, a reference numeral 204 indicates a portion of the silicon film where the silicon film is directly added with nickel and crystallized while a reference numeral 203 indicates a portion where the crystal grows in a lateral direction. The crystals grown in the lateral direction are about 25 μm. Also, the direction of the crystal growth is approximately along the axes of [111].

Figure 10B:
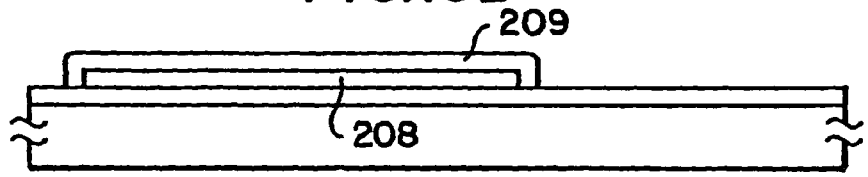

After the crystallization, the silicon oxide film 205 is removed. At this time, an oxide film formed on the silicon film in the opening 206 is simultaneously removed. Further, the silicon film 204 is patterned by dry etching to form an active layer 208 in the form of an island as shown in FIG. 10B. It should be noted that the nickel is contained in the silicon film at a higher concentration not only under the opening 206 where the nickel is directly added but also at a portion where top ends of the crystals exist.

The patterning of the silicon film should be done in such a manner that the patterned silicon film 208 should not include such portions at which nickel is contained at a higher concentration.

The patterned active layer 208 is then exposed to an atmosphere containing 100% aqueous vapor of 10 atm at 500-600° C., typically, 550° C. for one hour in order to oxidize the surface thereof and thus to form a silicon oxide film 209 of 1000 Å. After the oxidation, the substrate is maintained in an ammonium atmosphere (1 atm, 100%) at 400° C. At this condition, the silicon oxide film 209 is irradiated with an infrared light having an intensity peak at a wavelength in the range of 0.6-4 μm, for example, 0.8-1.4 μm for 30-180 seconds in order to nitride the silicon oxide film 209. HCl may be added to the atmosphere at 0.1 to 10%. A halogen lamp is used as a light source of the infrared light. The intensity of the IR light is controlled so that a temperature on the surface of a monitoring single crystalline silicon wafer is set between 900-1200° C. More specifically, the temperature is monitored by means of a thermocouple embedded in a single crystal silicon wafer and is transferred back to the IR light source (feed back). In the present example, the temperature rising rate is kept constant in the range of 50-200° C./sec. and also the substrate is cooled naturally at 20-100 ° C./sec. Since the IR light can heat the silicon film selectively, it is possible to minimize the heating of the glass substrate.

Figure 10C:
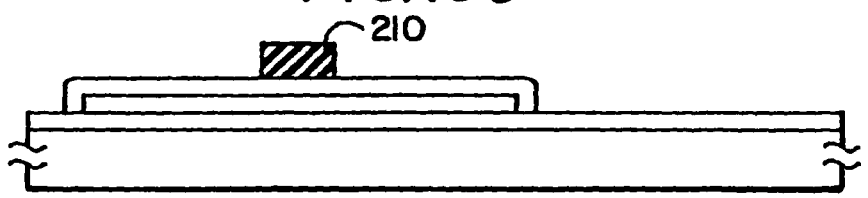

Referring to FIG. 10C, an aluminum film is formed by sputtering method to a thickness of 3000-8000 Å, for example, 6000 Å and then patterned into a gate electrode 210. The aluminum film may preferably contain scandium at 0.01-0.2%.

Figure 10D:
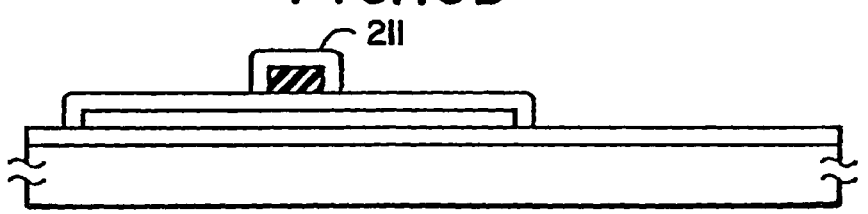

Referring to FIG. 10D, the surface of the aluminum electrode 210 is anodic oxidized to form an anodic oxide film 211 in an ethylene glycol solution containing a tartaric acid at 1-5%. The thickness of the oxide film 211 is 2000 Å, which will determine the size of an offset gate area which is to be formed in a later step as discussed below.

Figure 10E:
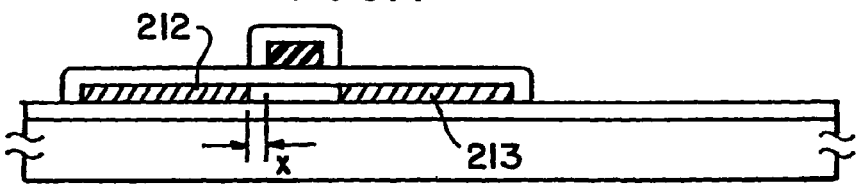

Referring then to FIG. 10E, using the gate electrode and the surrounding anodic oxide film as a mask, an N-type conductivity impurity (phosphorous, here) is introduced into the active layer in a self-aligning manner by ion doping method (also called as plasma doping method) in order to form impurity regions 212 and 213. Phosphine (PH$_3$) is used as a dopant gas. The acceleration voltage is 60-90 kV, for example, 80 kV. The dose amount is $1 \times 10^{15}$-$8 \times 10^{15}$ cm$^{-2}$, for example, $4 \times 10^{15}$ cm$^{-2}$. As can be seen in the drawing, the impurity regions 212 and 213 are offset from the gate electrode by a distance "x". This configuration is advantageous for reducing a leak current (off current) which occurs when applying a reverse bias voltage (i.e. a negative voltage in the case of an NTFT) to the gate electrode. In particular, since it is desired that electric charges stored in a pixel electrode be maintained without leaking in order to obtain an excellent display, the offset configuration is particularly advantageous when the TFT is used for controlling a pixel of an active matrix as is the case in the present example.

Thereafter, an annealing is performed with a laser irradiation. As a laser, a KrF excimer laser (wavelength: 248 nm, pulse width: 20 nsec.) or other lasers may be used. The conditions of the laser irradiation in the case of KrF excimer laser are: energy density is 200-400 mJ/cm$^2$, for example, 250 mJ/cm$^2$, a number of shots is 2-10 shots per one site, for example, 2 shots. Preferably, the substrate is heated to 200-450° C. to enhance the effect of the irradiation.

Figure 10F:
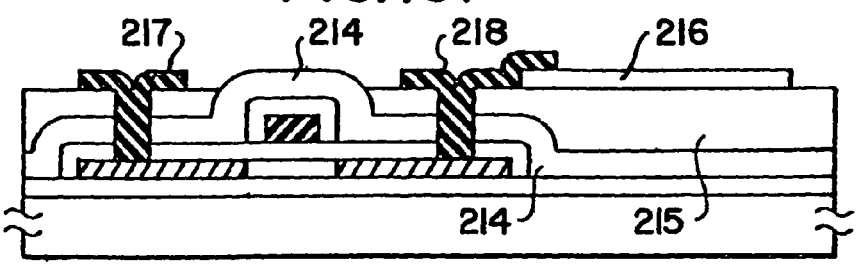

Referring to FIG. 10F, an interlayer insulating film 214 of silicon oxide is formed through a plasma CVD to a thickness of 6000 A. Further, a transparent polyimide film 215 is formed by spin coating to obtain a leveled surface. Then, a transparent conductive film made of indium tin oxide for example is formed on the leveled surface by sputtering to a thickness of 800 A and patterned into a pixel electrode 216.

The interlayer insulating films 214 and 215 are provided with contact holes therethrough, through which electrode/wirings 217 and 218 can reach the impurity regions of the TFT. The electrode/wirings 217 and 218 are formed of a metallic material, for example, a multi-layer of titanium nitride and aluminum. Finally, an annealing in a hydrogen atmosphere of 1 atm is carried out at 350° C. for 30 minutes in order to complete a pixel circuit of an active matrix circuit having TFTs.

EXAMPLE 5

This example is directed to a manufacture of a TFT and will be described with reference to FIGS. 11A-11D. The same reference numerals will be referred to for describing the same or similar elements as those of the previous example.

Figure 11A:
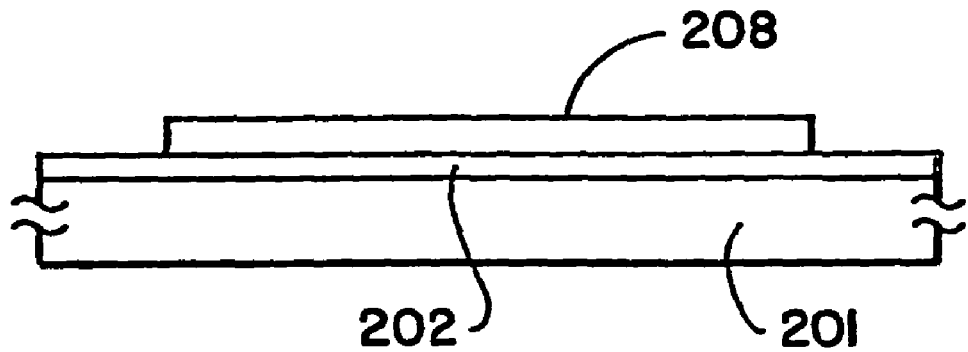
FIGS. 11A-11D are cross sectional views showing a manufacturing process of a TFT in accordance with Example 5 of the present invention.

Referring to FIG. 11A, a base film 202 of silicon oxide is initially formed on a Corning 7059 substrate 201 by sputtering to 2000 A thick. The substrate is annealed at a temperature higher than a distortion point of the substrate following which the glass is cooled to a temperature less than the distortion point at a rate of 0.1-1.0° C./minute. Thereby, it is possible to reduce a contraction of the substrate due to a substrate heating which occurs later (for example, thermal oxidation, thermal annealing), as a result, a mask alignment process will be facilitated. This step may be performed either before or after the formation of the base film 201 or it may be done both before and after the formation of the base film 201. In the case of using the Corning 7059 substrate, the substrate may be heated at 620-660° C. for 1-4 hours, following which it is cooled at 0.1-0.3° C. and taken out from a furnace when the temperature decreases to 400-500° C.

Then, an intrinsic (I-type) amorphous silicon film is formed to 500-1500 ÅÅ thick, for example, 1000 Å through plasma CVD. The amorphous silicon film is crystallized in the same manner as in Example 1. Therefore, the redundant explanation will be omitted. After the crystallization, the silicon film is patterned into an island form having a dimension of 10-1000 microns square. Accordingly, a crystalline silicon film 208 in the form of an island is formed as an active layer of a TFT as shown in FIG. 11A.

Figure 11B:

Referring to FIG. 11B, the surface of the silicon film is oxidized by exposing the surface to an oxidizing atmosphere to form an oxide film 209. The oxidizing atmosphere contains an aqueous vapor at 70-90%. The pressure and the temperature of the atmosphere is 1 atm and 500-750° C., typically 600° C. The atmosphere is produced by a pyrogenic reaction from oxygen and hydrogen gases with a hydrogen/oxygen ratio being 1.5-1.9. The silicon film is exposed to the thus formed atmosphere for 3-5 hours. As a result, the oxide film 209 having a thickness of 500-1500 A, for example, 1000 A is formed. Since the surface of the silicon film is reduced (eaten) by 50 A or more due to the oxidation, an effect of a contamination of the upper most surface of the silicon film does not extend to the silicon-silicon oxide interface. In other words, by the oxidation, it is possible to obtain a clean silicon-silicon oxide interface. Also, since the thickness of the silicon oxide film is two times as the thickness of the portion of the silicon film to be oxidized, when the silicon film is originally 1000 A thick and the silicon oxide film obtained is 1000 A, the thickness of the silicon film remaining after the oxidation is 500 A.

Generally, the thinner a silicon oxide film (gate insulating film) and an active layer are, the higher a mobility is and the smaller an off current is. On the other hand, a preliminary crystallization of an amorphous silicon film is easier when its thickness is thicker. Accordingly, there was a contradiction in the crystallization process and electrical characteristics with respect to the thickness of the active layer. The present example advantageously solves this problem. That is, the amorphous silicon film having a larger thickness is initially formed so that a better crystalline silicon film can be obtained, following which the thickness of the silicon film is reduced by the oxidation, resulting in an improvement of characteristics of the active layer of a TFT. Moreover, an amorphous component or grain boundaries contained in the crystalline silicon film tend to be oxidized during the thermal oxidation, resulting in a decrease in recombination centers contained the active layer.

After the formation of the silicon oxide film 209 through thermal oxidation, the substrate is annealed in a 100% monoxide dinitrogen atmosphere at 1 atm and 600° C. for 2 hours.

Figure 11C:
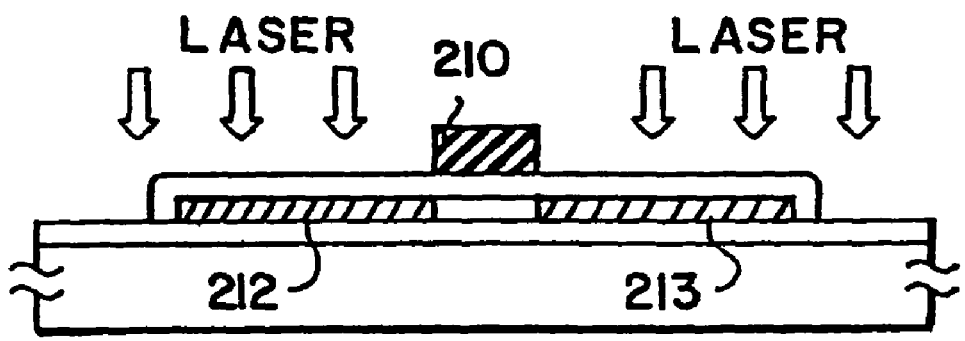

Referring to FIG. 11C, a silicon containing 0.01 to 0.2% phosphorous is deposited through low pressure CVD to 3000-8000 A thick, for example, 6000 A, and then patterned into a gate electrode 210. Further, using the gate electrode 210 as a mask, an N-type conductivity impurity is added into a portion of the active layer in a self-aligning manner by ion doping. Phosphine is used as a dopant gas. The doping condition is substantially the same as in the Example 4. The dose amount is, for example, $5\times10^{15}$ cm$^{-2}$. Thus, N-type impurity regions 212 and 213 are formed.

Thereafter, an annealing is performed with a KrF excimer laser in the same manner as set forth in Example 4. The laser annealing may be replaced by a lamp annealing with a near infrared ray. The near infrared ray is absorbed by crystalline silicon more effectively than by amorphous silicon. Accordingly, the annealing with the near infrared ray is comparable with a thermal annealing at 1000° C. or more. On the other hand, it is possible to prevent the glass substrate from being detrimentally heated inasmuch as the near infrared ray is not so absorbed by the glass substrate. That is, although a far infrared ray can be absorbed by a glass substrate, visible or near infrared ray of which wavelength ranges from 0.5-4 μm are not so absorbed.

Figure 11D:
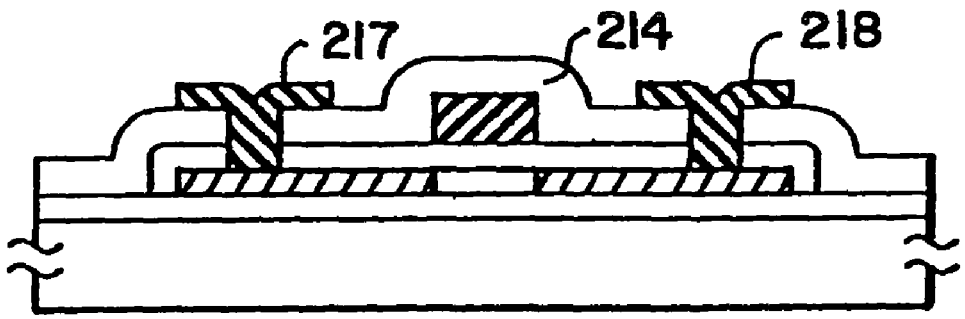

Referring to FIG. 11D, an interlayer insulating film 214 of silicon oxide is formed to 6000 A thick by a plasma CVD. A polyimide may be used instead of silicon oxide. Further, contact holes are formed through the insulating film. Electrode/wirings 217 and 218 are formed through the contact holes by using a multilayer of titanium nitride and aluminum films. Finally, an annealing in a hydrogen atmosphere is conducted at 350° C. and 1 atm for 30 minutes. Thus, a TFT is completed.

The mobility of the thus formed TFT is 110-150 cm$^2$/Vs. The S value is 0.2-0.5 V/digit. Also, in the case of forming a P-channel type TFT by doping boron into source and drain regions, the mobility is 90-120 cm$^2$/Vs and the S value is 0.4-0.6 V/digit. The mobility in accordance with the present example can be increased by 20% or more and the S value can be reduced by 20% or more as compared with a case where a gate insulating film is formed by a known PVD or CVD.

Also, the reliability of the TFT in accordance with the present example is comparable to that of a TFT which is produced through a thermal oxidation at a temperature as high as 1000° C.

EXAMPLE 6

Figure 12:
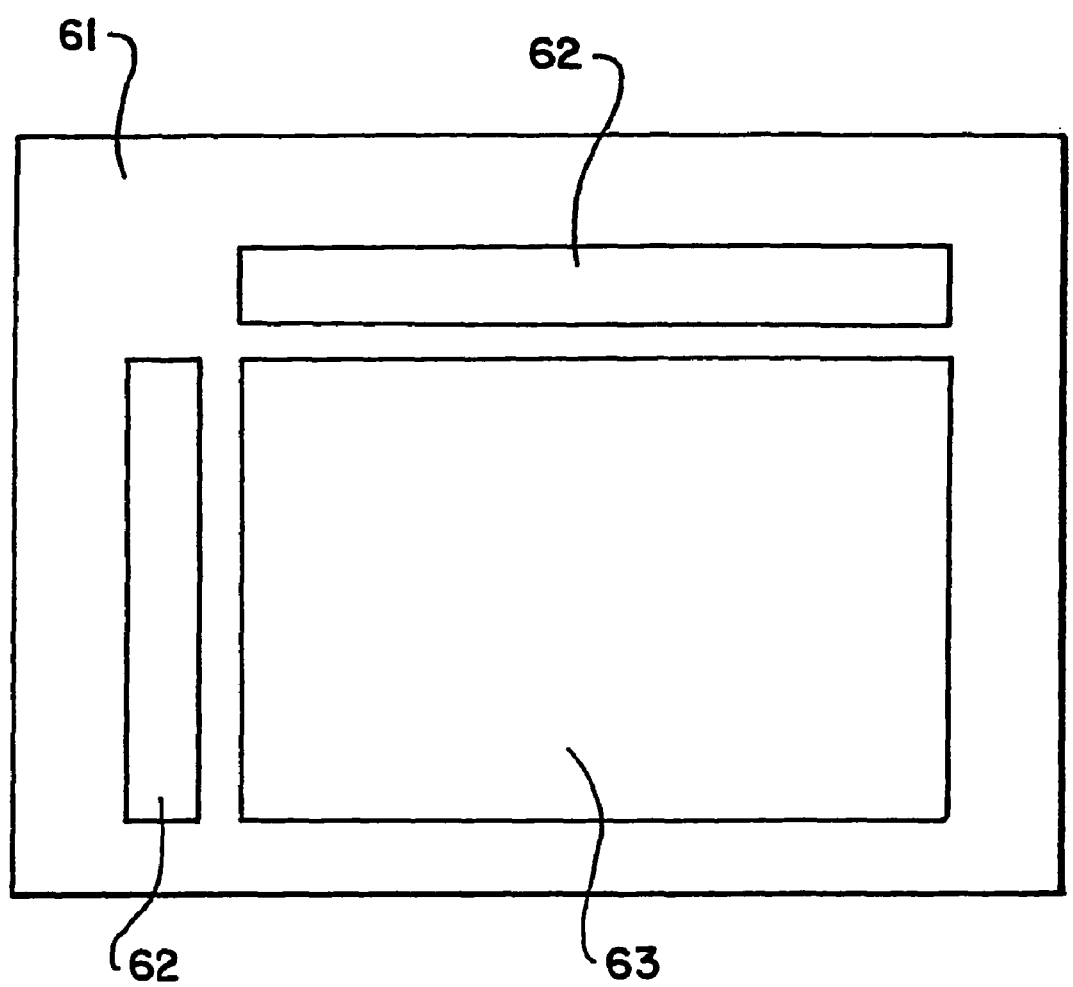
FIG. 12 shows a schematic diagram of an active matrix type electro-optical device in accordance with Example 6 of the present invention.

FIG. 12 shows an example of an active matrix type liquid crystal device in accordance with the present example.

In the figure, reference numeral 61 shows a glass substrate, and 63 shows a pixel area having a plurality of pixels in the form of a matrix each of which is provided with a TFT as a switching element. Reference numeral 62 shows peripheral driver region(s) in which driver TFTs are provided in order to drive the TFTs of the pixel area. The pixels area 63 and the driver region 62 are united on the same substrate 61.

The TFTs provided in the driver region 62 need to have a high mobility in order to allow a large amount of electric currents to pass therethrough. Also the TFTs provided in the pixel area 63 need to have a lower leak current property in order to increase a charge retention ability of pixel electrodes. For example, the TFTs manufactured in accordance with Example 3 are suitable as the TFTs of the pixel area 63.

EXAMPLE 7

The present example is a modification of Example 1. That is, before forming a nickel acetate aqueous solution, a rubbing treatment is performed on a silicon oxide surface in order to form number of minute scratches there.

Figure 13A:
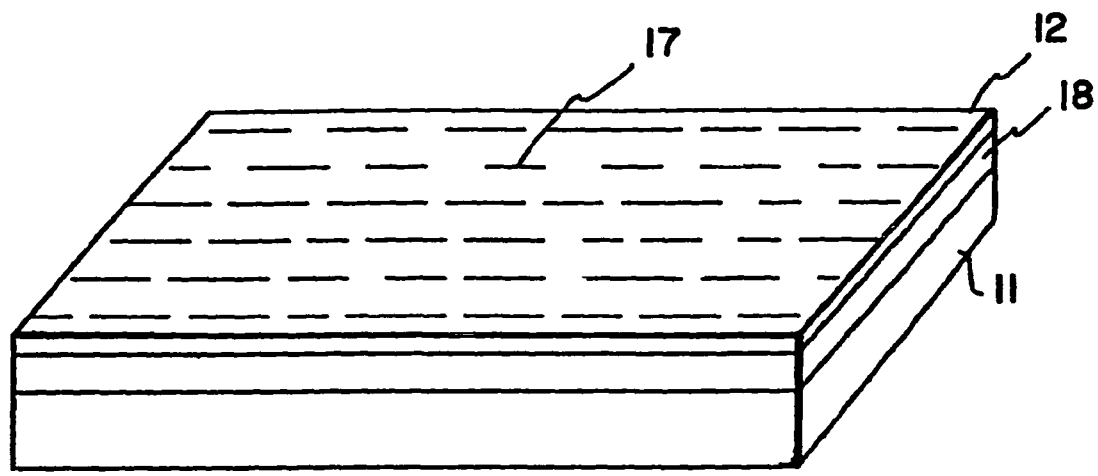
FIGS. 13A and 13B are cross sectional views showing the formation of a crystalline silicon film in accordance with Example 7 of the present invention.

Referring to FIG. 13A, a Corning 7059 substrate 11 having a silicon oxide film as a base film 18 is provided. The silicon oxide film is formed by sputtering to a thickness of 2000 A for example. On the silicon oxide film, an amorphous silicon film 12 is formed by plasma CVD to a thickness of 300-800 A, for example, 500 A. Subsequently, the surface of the amorphous silicon film is treated with a hydrofluoric acid in order to remove a contamination or a natural oxide formed thereon. After that, a silicon oxide film of 10-100 Å thick is formed by exposing the substrate in an oxygen atmosphere with the surface being irradiated with a UV light (not shown). The oxidation may be carried out with a hydrogen peroxide treatment or thermal oxidation.

Then, fine scratches (unevenness or irregularity) are formed on the silicon oxide film by a rubbing treatment as shown by reference numeral 17. The rubbing treatment is carried out with a diamond paste. However, a cotton cloth or a rubber may be used instead of diamond paste. It is desirable that scratches have a uniform direction, width and gap.

After the rubbing treatment, a film of nickel acetate is formed by spin coating in the same manner as in Example 1. The nickel acetate solution is absorbed by the scratches uniformly.

Figure 13B:
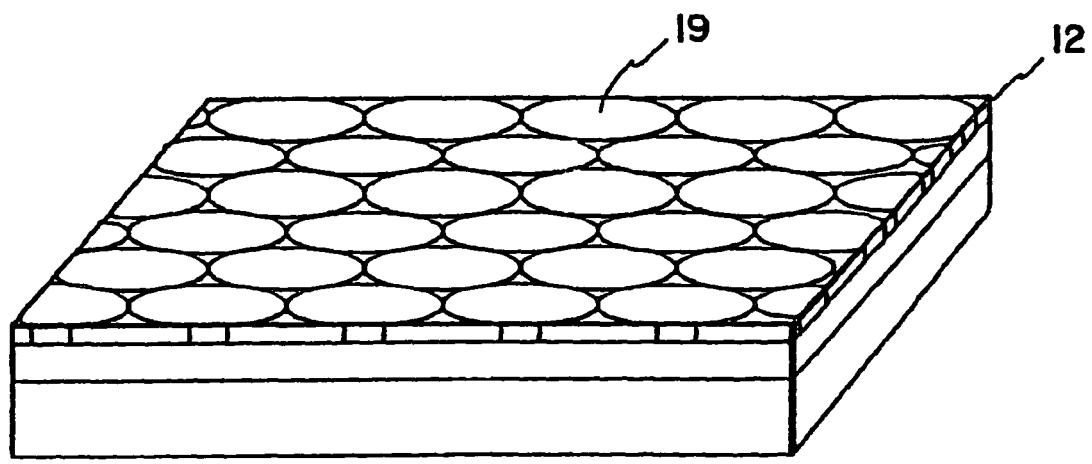

Referring to FIG. 13B, the amorphous silicon film is then furnace annealed at 550° C. for 4 hours in a nitrogen atmosphere like in Example 1. Thus, a crystalline silicon film is obtained. The grain sizes and orientation directions of the grains 19 in the thus obtained film are more uniform than that obtained in Example 1. The grains 19 are extended in one direction and have an approximately rectangular or ellipse shape or the like.

The dimension or number of scratches can be controlled by changing a density of the diamond paste. Since it is difficult to observe the scratches with a microscope, the rubbing condition is determined in such a manner that the size of grains or density of remaining amorphous silicon in the obtained crystalline silicon film can be maximized. In this example, the condition of the treatment is selected so that lengths of amorphous regions which remain after the crystallization be 1 μm or less, preferably, 0.3 μm or less.

In the case of Example 1 in which a rubbing treatment is not performed, there is a tendency that the nickel is not uniformly diffused and non-crystallized regions in the form of 1-10 μm circles are observed. Accordingly, the rubbing treatment improves the uniformity of the obtained crystals.

EXAMPLE 8

The present example is directed to a manufacturing process of TFTs for switching pixels of an active matrix in accordance with Example 7. FIGS. 14A-14E are cross sectional views showing the manufacturing process.

Referring to FIG. 14A, a silicon oxide film 202 is formed by a plasma CVD to a thickness of 3000 A on a substrate 201 made of Corning 7059 glass (10 cm square). Then, an amorphous silicon film 203 is formed by plasma CVD to a thickness of 300-1000 A, for example, 500 A on the silicon oxide film 202.

The thus formed amorphous silicon film is crystallized by the process as set forth in Example 7. After the thermal crystallization, a laser annealing is performed in order to improve the crystallinity with a Kr excimer laser (248 nm wavelength) having a power density 200-350 mJ/cm². As a result, amorphous components which remain in the crystalline silicon film are completely crystallized.

Figure 15A:
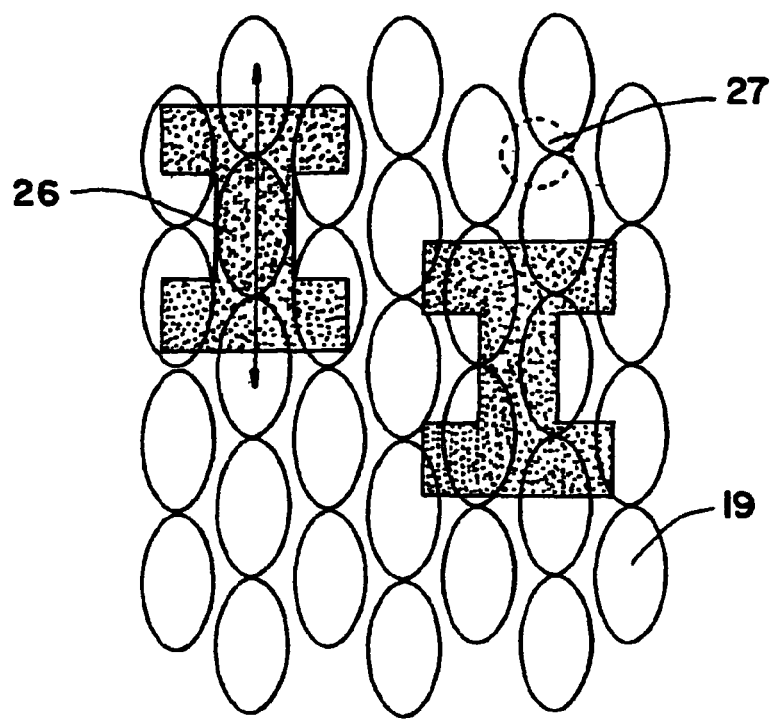
FIGS. 15A and 15B are schematic diagrams showing an arrangement of an active layer of a TFT in accordance with Example 8 of the present invention.
Figure 15B:
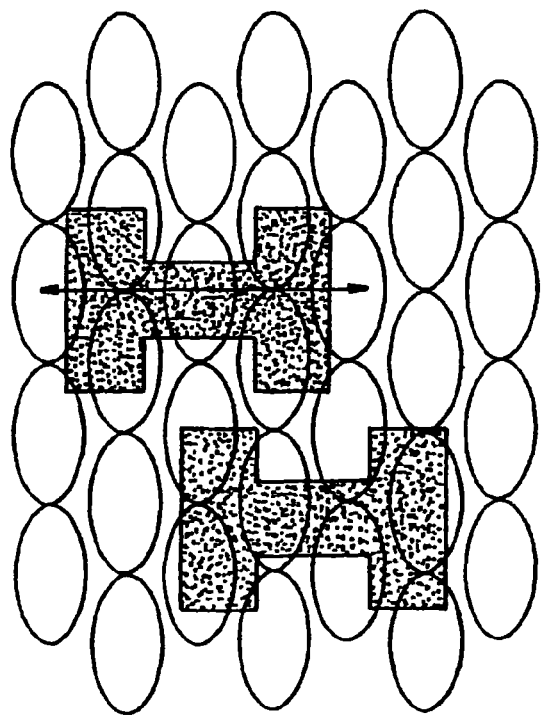

After the crystallization, the silicon film 203 is patterned into an island form silicon film 208 as shown in FIG. 14B. At this time, the location and the direction of the silicon island with respect to grain boundaries can be selected in such a manner as shown in FIGS. 15A and 15B.

When an electric current of a TFT crosses grain boundaries, the grain boundaries function as a resistance. On the other hand, the electric current is easy to flow along grain boundaries. Accordingly, the electrical characteristics of a TFT is greatly influenced by the number and direction of the grains (grain boundaries) included in the channel region. For example, when there are a number of TFTs, a leak current property of each TFT varies depending upon the number and direction of the grains contained in the channel region thereof.

The above problem becomes serious when the size of the grains is approximately the same as the size of the channel or is smaller than that. When the channel is sufficiently larger than grains, this dispersion is averaged and is not observed significantly.

For example, if there is no grain boundary in the channel, it can be expected that the TFT has an electrical property which is the same as that of a single crystalline TFT. On the other hand, when grain boundaries extend through the island along a direction of a drain current, the leak current becomes larger. In contrast, when grain boundaries extend in a direction perpendicular to a direction of a drain current, the leak current becomes smaller.

When TFTs are arranged in such a manner that its drain current flows in a direction along the rubbing direction, since crystals lengthen along the rubbing direction, the number of grain boundaries included in a channel tends to be nonuniform and therefore the leak current is likely to disperse. Moreover, the intensity of the leak current becomes larger because the grain boundaries are aligned with the direction of the drain current as shown in FIG. 15A. On the other hand, as shown in FIG. 15B, if a drain current flows in a direction perpendicular to the rubbing direction, the off current property can be stabilized. This is because the width of the grains 19 are approximately constant and the number of grains existing in the channel region 26 can be made constant. In conclusion, it is desirable to arrange the active region 208 in such a way that a drain current of a TFT flows in a direction perpendicular to the direction of grain boundaries, i.e. the rubbing directions. Moreover, the rubbing treatment makes the size of crystal grains uniform, which results in that non-crystallized region can be epitaxially crystallized by a subsequent laser irradiation.

As shown in FIG. 14B, a silicon oxide film of 200-1500 Å thick, for example, 1000 Å thick is formed as a gate insulating film 209 through plasma CVD.

Then, an aluminum containing Si at 1 weight % or Sc at 0.1 to 0.3 weight % is sputter formed to 1000 Å to 3 µm, for example 5000 Å, following which it is patterned into a gate electrode 210. The aluminum electrode is then subjected to an anodic oxidation process using an ethylene glycol solution containing a tartaric acid at 1-3%. The pH of the electrolyte is about 7. A platinum electrode is used as a cathode while the aluminum electrode is used as an anode. The voltage is increased with an electric current maintained constant until it reaches 220 V and then this condition is maintained for one hour. As a result, an anodic oxide film 211 is formed to a thickness of 1500-3500 Å, for example 2000 Å.

Referring to FIG. 14C, an impurity having one conductivity type (boron) is introduced into the silicon island through an ion doping method with the gate electrode 210 used as a mask in a self-aligning manner. Diborane ($B_2H_6$) is used as a dopant gas. The dose amount is $4\text{-}10\times10^{15}$ cm$^{-2}$. The acceleration voltage is 65 kV. Thus, a pair of impurity regions (p-type) 212 and 213 are obtained.

Thereafter, the impurity regions 212 and 213 are activated by irradiating KrF excimer laser (248 nm wavelength, 20 nsec. pulse width). The energy density of the laser beam is 200-400 mJ/cm$^2$, preferably, 250-300 mJ/cm$^2$.

Referring to FIG. 14D, an interlayer insulating film 214 made of silicon oxide is formed through plasma CVD to a thickness of 3000 Å. Then, a contact hole is formed on the impurity region 212 (source) through the interlayer insulating film 214 and the gate insulating film 209 by etching. An aluminum film is then formed by sputtering and patterned to form a source electrode 217.

Referring to FIG. 14E, silicon nitride is deposited through plasma CVD to 2000-6000 Å as a passivation film 215. A contact hole is formed on the impurity region (drain) 213 through the passivation film 215, interlayer insulating film 214 and the gate insulating film 209 by etching. Finally, an indium tin oxide film (ITO) is formed into a pixel electrode 216. Thus, a pixel TFT is obtained.

While the present invention has been disclosed in preferred embodiments, it is to be understood that the scope of the present invention should not be limited to the specific examples of the embodiments. Various modifications may be made.

For example, the nickel containing film may be formed by using a non-aqueous solution such as alcohol. When using an alcohol, the solution may be directly formed on the amorphous silicon film without using an oxide film. Specifically, a nickel containing compound such as nickel acetyl acetonate may be dissolved by ethanol. This material can be decomposed during the heating for the crystallization because the decomposition temperature thereof is relatively low. The amount of the nickel acetyl acetonate is selected so that the concentration of the nickel in the solution is controlled to be 100 ppm. The nickel containing film can be obtained by coating the solution and then dried by a spin dry method at 1500 rpm for 1 minute. Also, since the contact angle of the alcohol is smaller than that of water, the amount of the solution used for forming the film may be smaller than in the case when a water solution is used. In this case, a drop of 2 ml with respect to 100 mm square is appropriate. The subsequent steps for forming the crystalline silicon may be entirely the same as those explained in the preferred embodiments.

For another example, an elemental nickel may be dissolved by an acid. That is, a nitric acid of 0.1 mol/l is used as an acid. Nickel powder is dissolved in this acid at 50 ppm.

What is claimed:

1. A method for manufacturing a semiconductor device comprising the steps of:
   forming a semiconductor film comprising amorphous silicon over a substrate;
   forming an oxide film on the semiconductor film;
   disposing a material which contains a metal on the oxide film, the metal being capable of promoting crystallization of silicon;
   heating the semiconductor film so that the metal diffuses through the oxide film so as to be introduced into the semiconductor film whereby the semiconductor film is crystallized.

2. The method according to claim 1 wherein the metal is selected from the group consisting of Ni, Pd, Pt, Cu, Ag, Au, In, Sn, As and Sb.

3. The method according to claim 1 wherein the material which contains a metal is a liquid.

4. The method according to claim 1 wherein a thickness of the oxide film is 100 Å or less.

5. The method according to claim 1 wherein the oxide film is formed by oxidizing a surface of the semiconductor film.

6. A method for manufacturing a semiconductor device comprising the steps of:
   forming a semiconductor film comprising amorphous silicon over a substrate;
   forming an oxide film on a selected region of the semiconductor film;
   disposing a material which contains a metal on the oxide film, the metal being capable of promoting crystallization of silicon;
   heating the semiconductor film so that the metal diffuses through the oxide film so as to be introduced into the semiconductor film whereby the semiconductor film is crystallized in such a manner that crystallization proceeds laterally from the selected region of the semiconductor film to a region adjacent to the selected region.

7. The method according to claim 6 wherein the metal is selected from the group consisting of Ni, Pd, Pt, Cu, Ag, Au, In, Sn, As and Sb.

8. The method according to claim 6 wherein the material which contains a metal is a liquid.

9. The method according to claim 6 wherein a thickness of the oxide film is 100 Å or less.

10. The method according to claim 6 wherein the oxide film is formed by oxidizing a surface of the semiconductor film.

11. A method for manufacturing a semiconductor device comprising the steps of:
    forming a semiconductor film comprising amorphous silicon on an insulating surface;
    forming a silicon containing film on the semiconductor film;
    disposing a material which contains a metal on the silicon containing film, the metal being capable of promoting crystallization of silicon;
    heating the semiconductor film so that the metal diffuses through the silicon containing film so as to be introduced into the semiconductor film whereby the semiconductor film is crystallized.

12. The method according to claim 11 wherein the metal is selected from the group consisting of Ni, Pd, Pt, Cu, Ag, Au, In, Sn, As and Sb.

13. The method according to claim 11 wherein the material which contains a metal is a liquid.

14. The method according to claim 11 wherein a thickness of the silicon containing film is 100 Å or less.

15. The method according to claim 11 wherein the silicon containing film comprises silicon oxide.

16. A method for manufacturing a semiconductor device comprising the steps of:

forming a semiconductor film comprising amorphous silicon on an insulating surface;

forming a silicon containing film on a selected region of the semiconductor film;

disposing a material which contains a metal on the silicon containing film, the metal being capable of promoting crystallization of silicon;

heating the semiconductor film so that the metal diffuses through the silicon containing film so as to be introduced into the semiconductor film whereby the semiconductor film is crystallized in such a manner that crystallization proceeds laterally from the selected region of the semiconductor film to a region adjacent to the selected region.

17. The method according to claim 16 wherein the metal is selected from the group consisting of Ni, Pd, Pt, Cu, Ag, Au, In, Sn, As and Sb.

18. The method according to claim 16 wherein the material which contains a metal is a liquid.

19. The method according to claim 16 wherein a thickness of the silicon containing film is 100 Å or less.

20. The method according to claim 16 wherein the silicon containing film comprises silicon oxide.

21. The method according to claim 1 wherein the material containing the metal is selectively disposed on a portion of the oxide film.

* * * * *